(12) United States Patent
Chou et al.

(10) Patent No.: US 9,846,761 B2
(45) Date of Patent: Dec. 19, 2017

(54) MASK DESIGN BASED ON SENSITIVITIES TO CHANGES IN PATTERN SPACING

(71) Applicant: TAIWAN SEMICONDUCTOR MANUFACTURING COMPANY, LTD., Hsinchu (TW)

(72) Inventors: Chih-Cheng Chou, New Taipei (TW); Te-Yu Liu, Xinpu Township (TW); Ke-Ying Su, Taipei (TW); Hsien-Hsin Sean Lee, Duluth, GA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/266,621

(22) Filed: Sep. 15, 2016

(65) Prior Publication Data

US 2017/0004252 A1    Jan. 5, 2017

Related U.S. Application Data

(63) Continuation of application No. 14/182,859, filed on Feb. 18, 2014, now Pat. No. 9,448,467.

(51) Int. Cl.
```
G06F 17/00     (2006.01)
G06F 17/50     (2006.01)
G03F 1/00      (2012.01)
G03F 1/70      (2012.01)
```
(52) U.S. Cl.
CPC ........... *G06F 17/5081* (2013.01); *G03F 1/00* (2013.01); *G03F 1/70* (2013.01); *G06F 17/5009* (2013.01)

(58) Field of Classification Search
USPC ........................................... 716/51
See application file for complete search history.

(56) References Cited

U.S. PATENT DOCUMENTS

| | | | |
|---|---|---|---|
| 7,971,176 B2 | 6/2011 | Desineni | |
| 8,119,310 B1 | 2/2012 | Lu et al. | |
| 8,252,489 B2 * | 8/2012 | Su ..................... | G06F 17/5036 382/144 |
| 8,415,089 B1 | 4/2013 | Gupta et al. | |

(Continued)

FOREIGN PATENT DOCUMENTS

| CN | CN102841500 | 12/2012 |
|---|---|---|
| TW | 200821768 | 5/2008 |
| TW | 201351176 | 12/2013 |

OTHER PUBLICATIONS

Office Action dated Jun. 19, 2017 from corresponding application No. CN 201410163233.3.

(Continued)

*Primary Examiner* — Mohammed Alam
(74) *Attorney, Agent, or Firm* — Hauptman Ham, LLP

(57) ABSTRACT

A layout of an integrated circuit design is provided and a plurality of multiple patterning decompositions is determined from the layout. Each decomposition of the plurality of multiple patterning decompositions includes patterns separated into masks. One or more files are generated that include sensitivities of pattern capacitances to changes in spacing between patterns due to mask shifts. Using the sensitivities and changes in spacing, respective worst-case performance values are determined for each decomposition. A mask set is selected based on the worst-case performance values.

20 Claims, 16 Drawing Sheets

(56) References Cited

U.S. PATENT DOCUMENTS

| | | | |
|---|---|---|---|
| 8,589,831 B1* | 11/2013 | Chang | G06F 17/5068 |
| | | | 716/50 |
| 8,850,367 B2 | 9/2014 | Lai | |
| 2005/0132306 A1 | 6/2005 | Smith | |
| 2012/0009511 A1* | 1/2012 | Dmitriev | G03F 1/72 |
| | | | 430/5 |
| 2012/0052422 A1* | 3/2012 | Lu | G03F 1/70 |
| | | | 430/30 |
| 2012/0054696 A1* | 3/2012 | Su | G06F 17/5036 |
| | | | 716/55 |
| 2013/0275927 A1* | 10/2013 | Su | G06F 17/5068 |
| | | | 716/53 |
| 2014/0304670 A1* | 10/2014 | Su | G06F 17/5068 |
| | | | 716/111 |
| 2015/0205905 A1* | 7/2015 | Ho | G06F 17/5081 |
| | | | 716/52 |
| 2017/0004252 A1* | 1/2017 | Chou | G03F 1/70 |

OTHER PUBLICATIONS

Office Action dated Nov. 6, 2015 from corresponding No. TW 103145540.

\* cited by examiner

Color Bias for Mask AAB Resistance — 502a

| W \ S | $S_1$ | $S_2$ | $S_3$ |
|---|---|---|---|
| $W_1$ | $R_{11}$ | $R_{12}$ | $R_{13}$ |
| $W_2$ | $R_{21}$ | $R_{22}$ | $R_{32}$ |

FIG. 5A

Color Bias for Mask AA Inductance — 502b

| W \ S | $S_1$ | $S_2$ | $S_3$ |
|---|---|---|---|
| $W_1$ | $L_{11}$ | $L_{12}$ | $L_{13}$ |
| $W_2$ | $L_{21}$ | $L_{22}$ | $L_{32}$ |

FIG. 5B

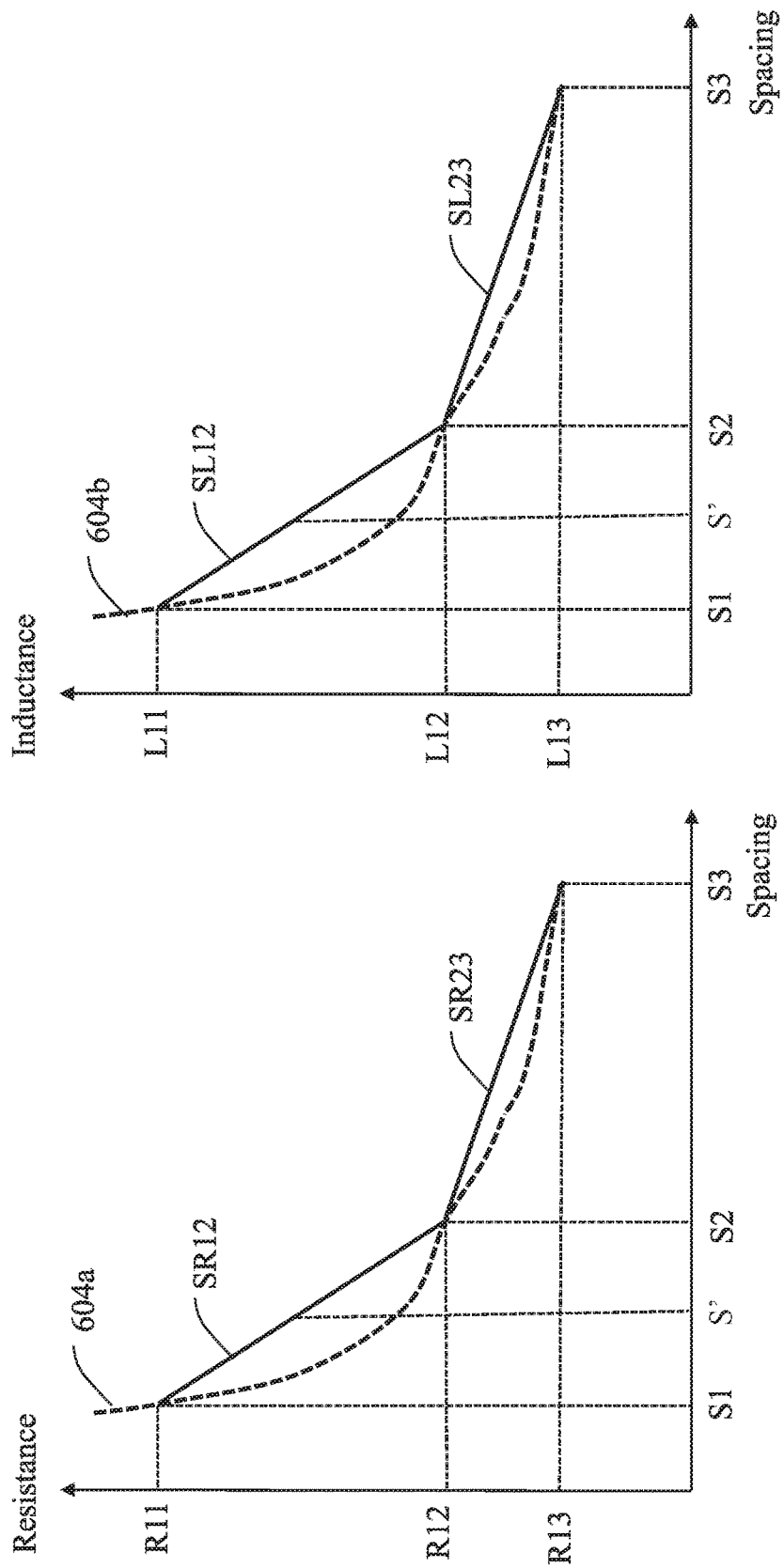

Color Bias for Mask AAB Sensitivity $\partial R_{AAA}/\partial s$ — 706a

| W \ S | $S_1 \sim S_2$ | $S_2 \sim S_3$ |
|---|---|---|
| $W_1$ | $(R_{12}-R_{11})/(S_2-S_1)$ | $(R_{13}-R_{12})/(S_3-S_2)$ |
| $W_2$ | $(R_{22}-R_{21})/(S_2-S_1)$ | $(R_{23}-R_{22})/(S_3-S_2)$ |

FIG. 7A

Color Bias for Mask AA Sensitivity $\partial L_{AA}/\partial s$ — 706b

| W \ S | $S_1 \sim S_2$ | $S_2 \sim S_3$ |
|---|---|---|
| $W_1$ | $(L_{12}-L_{11})/(S_2-S_1)$ | $(L_{13}-L_{12})/(S_3-S_2)$ |
| $W_2$ | $(L_{22}-L_{21})/(S_2-S_1)$ | $(L_{23}-L_{22})/(S_3-S_2)$ |

FIG. 7B

```
*VARIATION_PARAMETERS
*(index name min max)
1 M1_mask_x -0.01 0.03
2 M1_mask_y -0.01 0.02

C1 B    A    6.6e-16 *Scx_AlphaAlpha      1:-0.005 2:0.015 *Scy_AlphaAlpha    1:-0.003 2:0.013
C2 B    C    8.8e-16 *Scx_AlphaBeta       1:-0.005 2:0.015 *Scy_AlphaBeta     1:-0.003 2:0.013
R1 #b1 #b2   66      *Srx_AlphaAlphaBeta  1:-0.005 2:0.015 *Sry_AlphaAlphaBeta 1:-0.003 2:0.013
L1 B    A    6.6e-16 *Slx_AlphaAlpha      1:-0.005 2:0.015 *Sly_AlphaAlpha    1:-0.003 2:0.013
L2 B    C    8.8e-16 *Slx_AlphaAlpha      1:-0.005 2:0.015 *Sly_AlphaAlpha    1:-0.003 2:0.013
```

MASK DESIGN BASED ON SENSITIVITIES TO CHANGES IN PATTERN SPACING

PRIORITY CLAIM

The present application is a continuation of U.S. application Ser. No. 14/182,859, filed Feb. 18, 2014, which is incorporated herein by reference in its entirety.

RELATED APPLICATIONS

The present application is related to U.S. Pat. No. 8,119,310, entitled "Mask-Shift-Aware RC Extraction for Double Patterning Design," filed on Aug. 31, 2010, and U.S. Pat. No. 8,252,489, entitled "Mask-Shift-Aware RC Extraction for Double Patterning Design," filed on Jun. 24, 2011, both of which are incorporated herein by reference in their entireties.

BACKGROUND

Double patterning and multiple patterning are a technology developed for lithography to enhance feature density. Typically, for forming features of integrated circuits on wafers, lithography technology is used which involves applying a photo resist and defining patterns on the photo resist. The patterns in the patterned photo resist are first defined in a lithography mask, and are implemented either by the transparent portions or by the opaque portions in the lithography mask. The patterns in the photo resist are then transferred to the manufactured features.

With the increasing down-scaling of integrated circuits, the optical proximity effect posts an increasingly greater problem. When two or more separate features are too close to each other, the space and/or pitch between the features could be beyond the resolution limit of the light source. To solve such a problem, multiple patterning technology is utilized. In multiple patterning technology, the closely located features are separated into two or more masks of a same multiple-patterning mask set, with two or masks used to pattern the layer. In each of the multiple-patterning masks, the distances between features are increased over the distances between features in a single mask, and hence, the resolution limit can be overcome.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIG. 5A is a schematic view of data in a techfile in accordance with one or more embodiments;

FIG. 5B is a schematic view of data in a techfile in accordance with one or more embodiments;

FIG. 6A is a graph of resistances for one or more semiconductor elements in accordance with one or more embodiments;

FIG. 6B is a graph of resistances for one or more semiconductor elements in accordance with one or more embodiments;

FIG. 7A is a schematic view of data in a techfile in accordance with one or more embodiments;

FIG. 7B is a schematic view of data in a techfile in accordance with one or more embodiments;

FIG. 10 is a view of a netlist in accordance with one or more embodiments;

DETAILED DESCRIPTION

Figure 1A:
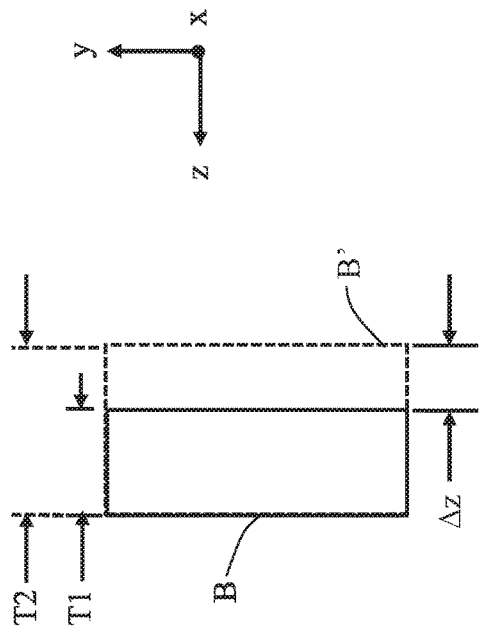
FIG. 1A is a cross-sectional view of a translation shift that occurs during the exposure of two mask patterns in accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

During the design of an integrated circuit, a layout is generated. One or more layout decompositions are performed for each layer of the layout in order to separate the components of each semiconductor layer based upon multiple patterning design rules. In some embodiments, a decomposition is a process of dividing a single mask into multiple masks, where each of the multiple masks are a part of the same multiple patterning mask set. Subsequently, resistance inductance network extraction and timing analysis are performed on each of the layout decompositions. In some embodiments, the resistance inductance network extraction comprises simulating a worst-case performance value for each of the layout decompositions and then comparing each of the worst-case performance values to determine a best among the worst-case performance values. The best among the worst-case performance values for each of the layout decompositions is then used to manufacture a multiple patterning mask set for the design of the integrated circuit.

In some embodiments, the resistance inductance network extraction and timing analysis account for mask pattern shifts that occur during the exposure of two or more mask patterns. In some embodiments, the resistance inductance network extraction accounts for resistance changes of semiconductor elements formed by each mask as a result of mask pattern shifts. In some embodiments, the resistance inductance network extraction accounts for inductance changes of semiconductor elements formed by each mask as a result of mask pattern shifts. In some embodiments, the resistance inductance network extraction accounts for capacitance changes of semiconductor elements formed by each mask as a result of mask pattern shifts.

FIG. 1A is a cross-sectional view of a translation shift that occurs during the exposure of two mask patterns in accordance with one or more embodiments. In some embodiments, patterns A and B are mask patterns formed in a same layer, e.g., such as a metal layer or any other layer involved in the formation of integrated circuits, e.g. a polysilicon layer. Patterns A and B are multiple patterning patterns, with pattern A being in a first lithography mask of a multiple patterning mask set, and pattern B in a second lithography mask of the same multiple patterning mask set. In some embodiments, patterns A and B are formed on a wafer at a different time. In some embodiments, multiple patterning refers to the use of two or more masks of the same multiple-patterning mask set such that two or masks are used to pattern a semiconductor layer. In some embodiments, mask patterns are represented by color. In some embodiments, pattern A is represented by mask color Alpha. In some embodiments, pattern B is represented by mask color Beta. In some embodiments, a mask pattern comprises one or more polygons. In some embodiments, each polygon is separated into a separate mask. In some embodiments, for a 20 nanometer (nm) semiconductor process, a mask pattern comprises one or more polygons. In some embodiments, for a 20 nm semiconductor process, each mask pattern is associated with at least two or more corresponding polygons. In some embodiments, for a 16 nm semiconductor process, a mask pattern comprises one or more polygons. In some embodiments, for a 16 nm semiconductor process, each mask pattern is associated with a corresponding polygon. In some embodiments, for a 10 nm semiconductor process, a mask pattern comprises one or more polygons. In some embodiments, for a 10 nm semiconductor process, each mask pattern is associated with a corresponding polygon.

As shown in FIG. 1A, mask patterns A and B are formed in the same semiconductor layer. Patterns A and B are separated by a spacing S and each have a width W. In some embodiments, pattern B is to be formed in the region bounded by the hashed lines (e.g., shown as pattern B'). However, process variations cause pate B' to shift from the position of pattern B' to the position of pattern B, such that pattern B is formed in the region bounded by the solid lines. The shift is represented as $\Delta x$, $\Delta y$ and $\Delta z$ (shown in FIG. 1B), with directions x and y being in the plane of the respective layer, which plane is also parallel to the major surfaces of the wafer. In some embodiments, the shift causes the capacitance between patterns A and B to vary, and also causes variations in integrated circuit performance values, e.g., such as timing and noise. In some embodiments, the shift causes the resistance of the regions formed by patterns A and B to vary, which also yields integrated circuit performance variation. In some embodiments, the shift causes the inductance of the regions formed by patterns A and B to vary, which also yields performance variation of the integrated circuit. In some embodiments, the inductance of the regions formed by patterns A and B comprises the inductance of each pattern as well as the mutual inductance between each pattern.

Figure 1C:
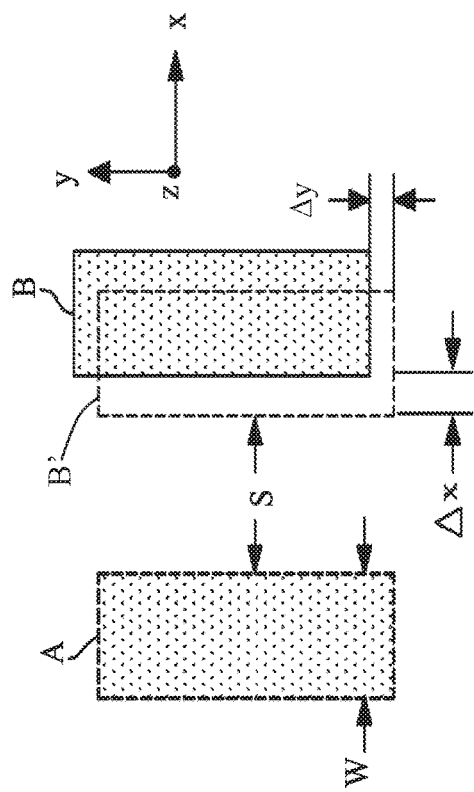
FIG. 1C is a cross-sectional view of a magnification shift of patterns A and B in accordance with one or more embodiments.
Figure 1B:
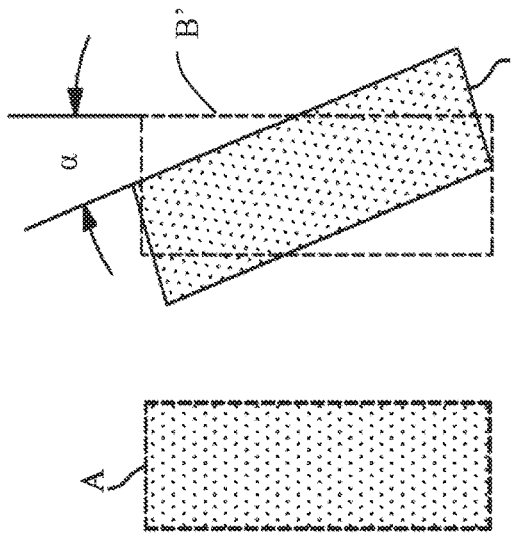
FIG. 1B is a cross-sectional view of a translation shift that occurs during the exposure of two mask patterns in accordance with one or more embodiments.

FIG. 1B is a cross-sectional view of a translation shift that occurs during the exposure of two mask patterns in accordance with one or more embodiments. FIG. 1B is a different cross-sectional view of the patterns A and B shown in FIG. 1A. Pattern B has a thickness of T1 and Pattern B' has a thickness of T2. In some embodiments, process variations cause pattern B' to be shifted by shift distance $\Delta z$. In some embodiments, the shift $\Delta z$ is the change in the thickness of patterns A and B.

FIG. 1C is a cross-sectional view of a magnification shift of patterns A and B in accordance with one or more embodiments. In some embodiments, a magnification shift is a shift in the size of the formed pattern such that the size of a pattern in at least the x, y or z direction is reduced by a ratio. In some embodiments, the ratio is the size of pattern B in the x, y or z direction divided by the size of pattern B' in the same corresponding direction (e.g., x, y or z direction). In some embodiments, a magnification shift is represented by $\Delta x$ for the x direction, $\Delta y$ for the y direction or $\Delta z$ for the z direction (for a cartesian coordinate representation). In some embodiments, the length, width or thickness of a pattern are changed by a ratio. In some embodiments, the ratio is substantially greater than or substantially equal to 1. In some embodiments, the ratio is substantially less than or substantially equal to 1. In some embodiments, the magnification shift affects the performance values of the capacitance, resistance or inductance of an integrated circuit.

Figure 1D:
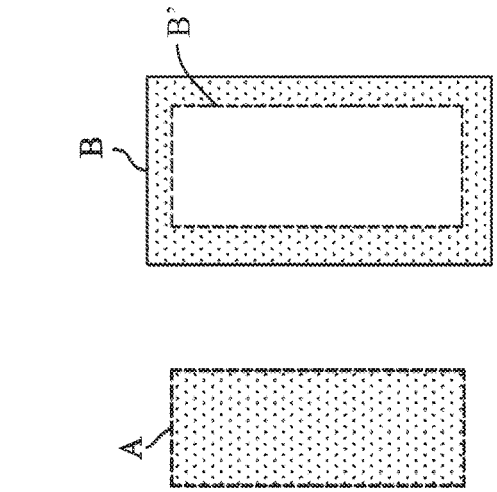
FIG. 1D is a cross-sectional view of a rotational shift of patterns A and B in accordance with one or more embodiments.

FIG. 1D is a cross-sectional view of a rotational shift of patterns A and B in accordance with one or more embodiments. In some embodiments, a rotational shift is an angular shift of pattern B relative to pattern B'. In some embodiments, the rotational shift is represented by rotation angle $\alpha$. In some embodiments, a rotational shift is represented by $\Delta x$ for the x direction, $\Delta y$ for the y direction or $\Delta z$ for the z direction (for a cartesian coordinate representation).

In one or more of the following embodiments, the shift (as represented by $\Delta x$, $\Delta y$ or $\Delta z$) is used to explain the concepts of each embodiment. However, the disclosure herein is applicable to each of the pattern shifts (e.g., translation shift, magnification shift or rotational shift). In some embodiments, for example, by replacing the shift Δx, Δy or Δz with the magnification ratio or the rotation angle α, the same concepts are used for each of the different coordinate system.

Figure 2A:
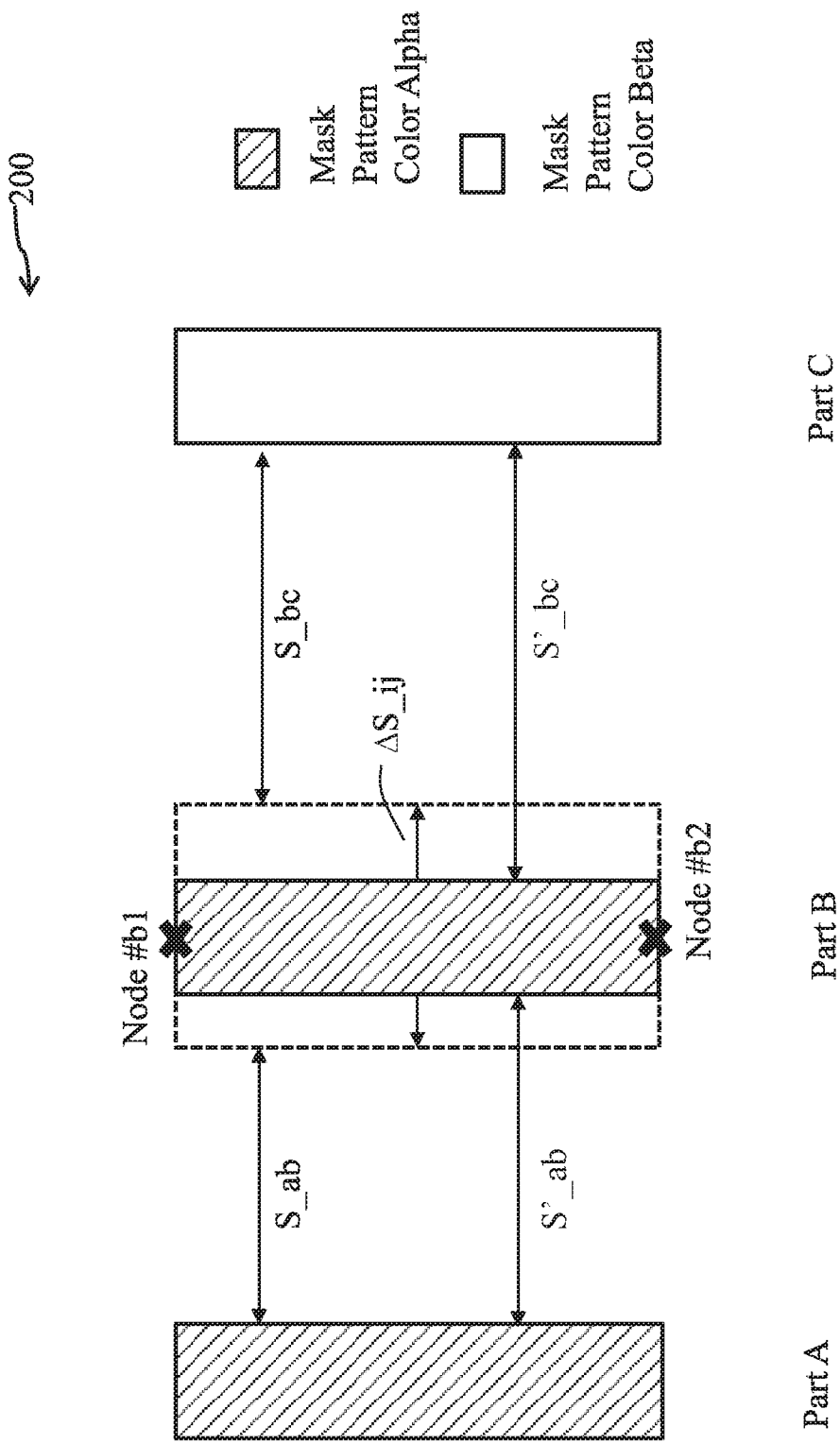
FIG. 2A is a cross-sectional view of mask pattern in accordance with one or more embodiments.

FIG. 2A is a cross-sectional view of a mask pattern 200 in accordance with one or more embodiments. Mask pattern 200 comprises two mask patterns (i.e., mask pattern color alpha and mask pattern color beta). Mask pattern color alpha includes semiconductor element part A and semiconductor element part B. Mask pattern color beta includes semiconductor element part C. In some embodiments, each mask pattern is associated with a corresponding semiconductor element. In some embodiments, each mask pattern is associated with two or more semiconductor elements. In some embodiments, one or more of semiconductor elements part A, part B or part C is a portion of one or more interconnects.

Figures 2B, 2C:
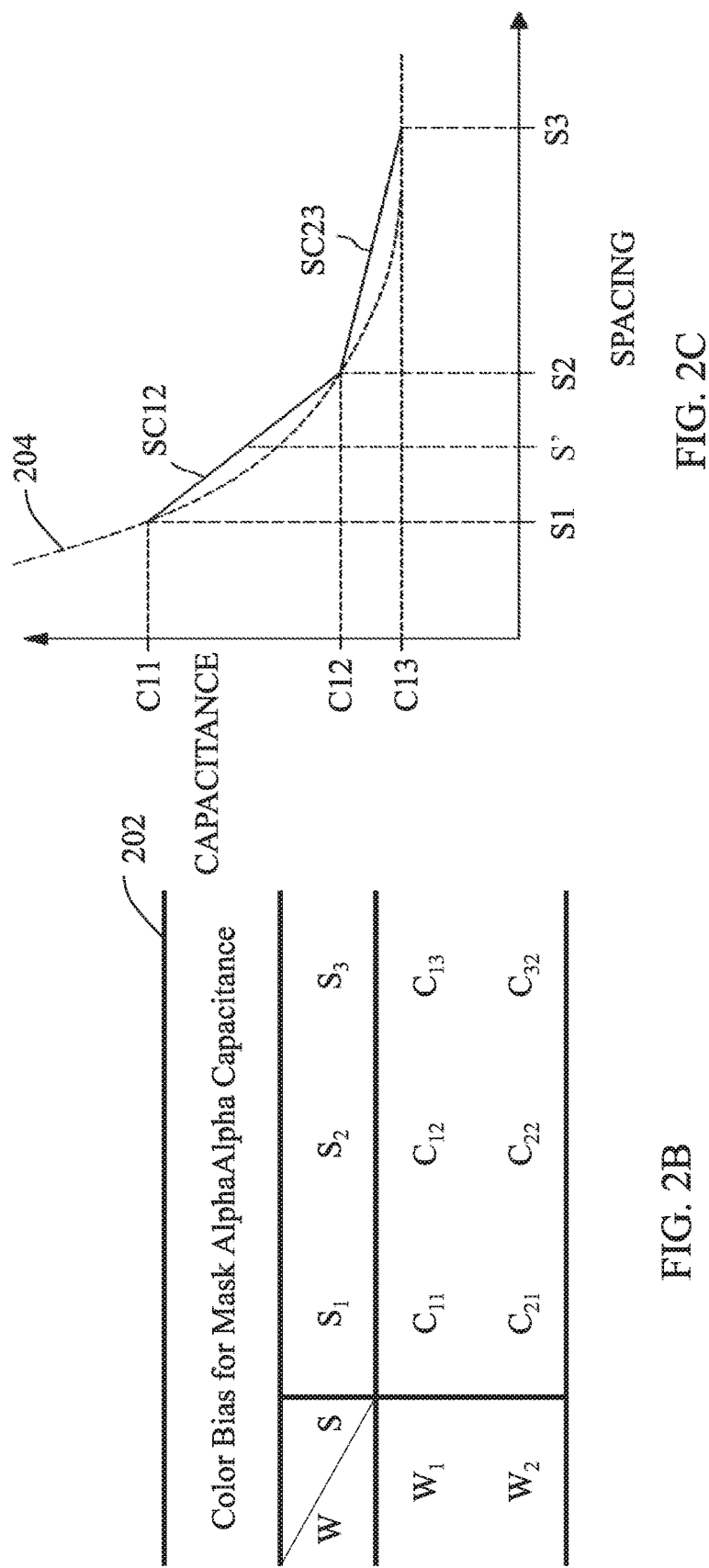
FIG. 2B is a schematic view of data in a techfile in accordance with one or more embodiments.
FIG. 2C is a graph of capacitances between two or more semiconductor elements in accordance with one or more embodiments.

FIG. 2B is a schematic view of data in a techfile 202 in accordance with one or more embodiments. In some embodiments, a techfile is a file that reflects one or more electrical properties between semiconductor elements as a function of spacing S, width W, height H or thickness T. In some embodiments, the one or more electrical properties comprise the capacitance, resistance or inductance of one or more integrated circuits. In some embodiments, the techfile is an array. In some embodiments, the information contained in the techfile comprises one or more data formats to store the information shown in techfile 202 in FIG. 2B. Techfile 202 is a techfile of the semiconductor element part B shown in FIG. 2A. In some embodiments, the techfile comprises a table.

Techfile 202 includes the parasitic capacitance between semiconductor part A and part B as a function of spacing S and width W. In some embodiments, a change in the widths W or spacing S results in a change in the capacitance between semiconductor element part A and part B. For example, if width W is equal to W1 and spacing S is equal to S1, then the respective capacitance is C11. For example, if width W is equal to W1 and spacing S is equal to S2, then the respective capacitance is C12. In some embodiments, the content in the techfiles are retrieved in the design tool simulation shown in FIG. 11. In some embodiments, the capacitances shown in FIG. 2B are for semiconductor element part A and part B, which are each part of mask pattern color alpha.

In some embodiments, a shift in the mask pattern affects both the spacing and the capacitance between two semiconductor elements; and each of the semiconductor elements are associated with one or more mask patterns. In some embodiments, each color bias techfile for capacitance is associated with a pair of mask patterns that affect the capacitance. For example, the color bias techfile shown in FIG. 2B is associated with a pair of mask patterns (i.e. mask pair "Alpha-Alpha"). In some embodiments, a similar color bias techfile for capacitance is associated with another pair of mask patterns (i.e. mask pair "Alpha-Beta"). In some embodiments, a similar color bias techfile for capacitance is associated with another pair of mask patterns (i.e. mask pair "Beta-Beta"). In some embodiments, a similar color bias techfile for capacitance is associated with another pair of mask patterns (i.e. mask pair "Beta-Alpha"). In some embodiments, the number of color bias techfiles for a capacitance is equal to $N^2$, where N is the number of mask patterns in a semiconductor layer. For example, for N equal to two mask patterns, four mask pattern combinations result.

FIG. 2C is a graph of capacitances between two or more semiconductor elements in accordance with one or more embodiments. FIG. 2C represents the capacitance between semiconductor element part A and part B as a function of spacing S. As shown in FIG. 2C, the curve 204 corresponds to the capacitance of semiconductor element part A. However, the number of entries in techfile 202 (shown in FIG. 2C) do not contain each of the data points in curve 204. For example, if semiconductor element part A and part B are separated by spacing S', and spacing S' is positioned between spacing S1 and spacing S2, then the capacitance corresponding to spacing S' is not retrieved directly from the techfile shown in FIG. 2B. In some embodiments, the capacitance corresponding to spacing S' is determined from a color capacitance sensitivity.

Figure 2D:
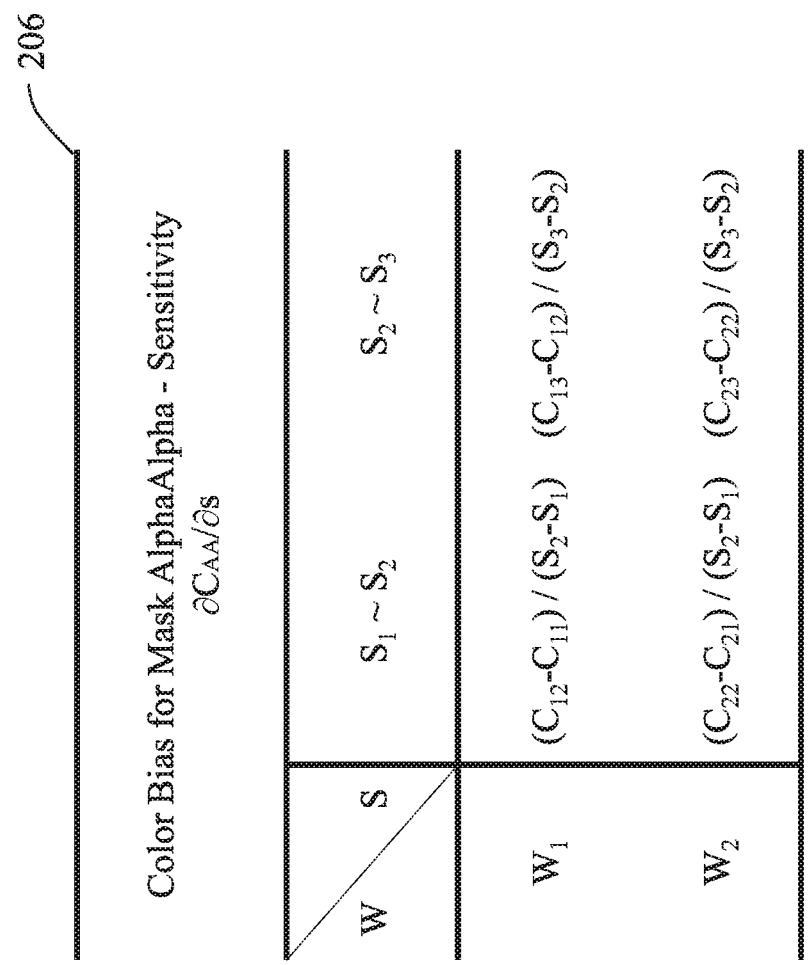
FIG. 2D is a schematic view of data in a techfile in accordance with one or more embodiments.

FIG. 2D is a schematic view of data in a techfile 206 in accordance with one or more embodiments. Techfile 206 includes the bias capacitance color sensitivities between semiconductor element part A and part B as a function of spacing S and width W. In some embodiments, the capacitance color sensitivity is related to the respective widths of semiconductor element part A or part B. As shown in FIG. 2D, the color sensitivity (C12-C11)/(S2-S1) corresponds to the slope SC12 (as shown in FIG. 2C as the solid line positioned between spacings S1 and S2). As shown in FIG. 2D, the color sensitivity (C13-C12)/(S3-S2) corresponds to the slope SC23 (as shown in FIG. 2C as the solid line positioned between spacings S2 and S3). Therefore, if a spacing is within the ranges defined between S1 and S2, or between the spacing ranges S2 and S3, the respective capacitance is calculated from the capacitance color sensitivities. The concept is further explained in FIGS. 3A-3B, FIG. 4 and Equation 3. In sonic embodiments, the capacitance sensitivities shown in FIG. 2D are for semiconductor element part A and part B, which are each part of mask pattern color alpha.

In some embodiments, each color bias sensitivity techfile for capacitance is associated with a pair of mask patterns that affect the capacitance. For example, the color bias sensitivity techfile shown in FIG. 2D is associated with a pair of masks (i.e. mask pair "Alpha-Alpha"). In some embodiments, a similar color bias sensitivity techfile for capacitance is associated with a pair of masks (i.e. mask pair "Alpha-Beta"). In some embodiments, a similar color bias sensitivity techfile for capacitance is associated with a pair of masks (i.e. mask pair "Beta-Beta"). In some embodiments, a similar color bias sensitivity techfile for capacitance is associated with a pair of masks (i.e. mask pair "Beta-Alpha"). In some embodiments, the number of color bias sensitivity techfiles for a capacitance is equal to $N^2$, where N is the number of mask patterns in a semiconductor layer. For example, for N equal to two mask patterns, four mask pattern combinations results in four color bias sensitivity techfiles for a capacitance.

Figure 3A:
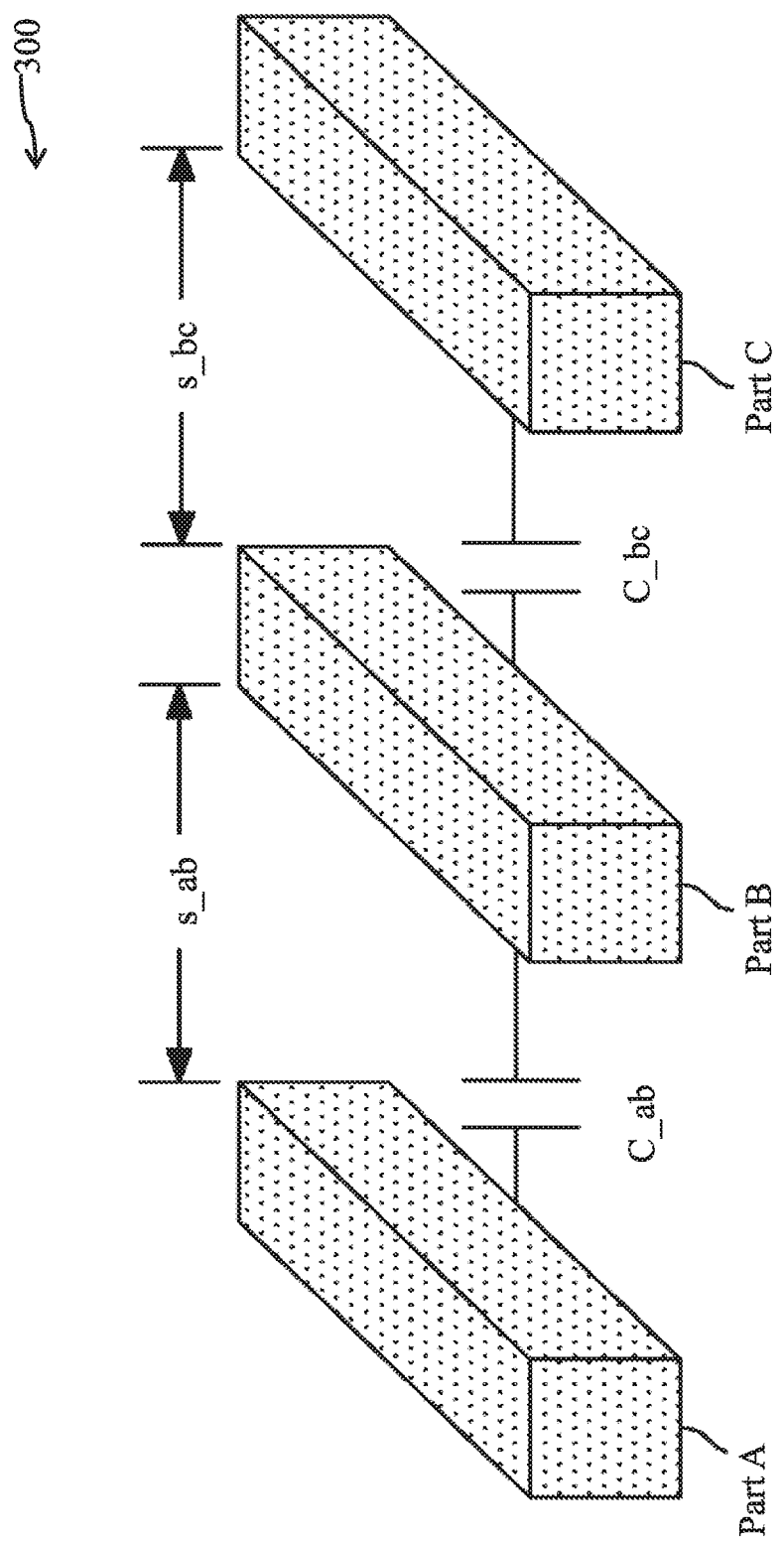
FIG. 3A is a cross-sectional view of mask pattern in accordance with one or more embodiments.

FIG. 3A is a cross-sectional view of mask pattern 300 in accordance with one or more embodiments. Mask pattern 300 comprises semiconductor element part A, semiconductor element part B and semiconductor element part C.

Semiconductor element part A, B, and C are multiple patterning patterns, with semiconductor element part A and semiconductor element part C being in a first lithography mask of a multiple patterning mask set, and semiconductor element part B in a second lithography mask of the multiple patterning mask set. Semiconductor element part A and semiconductor element part B are separated by spacing S_ab and form parasitic capacitance C_ab. Semiconductor element part B and semiconductor element part C are separated by spacing S_bc and form parasitic capacitance C_bc.

Figure 3B:
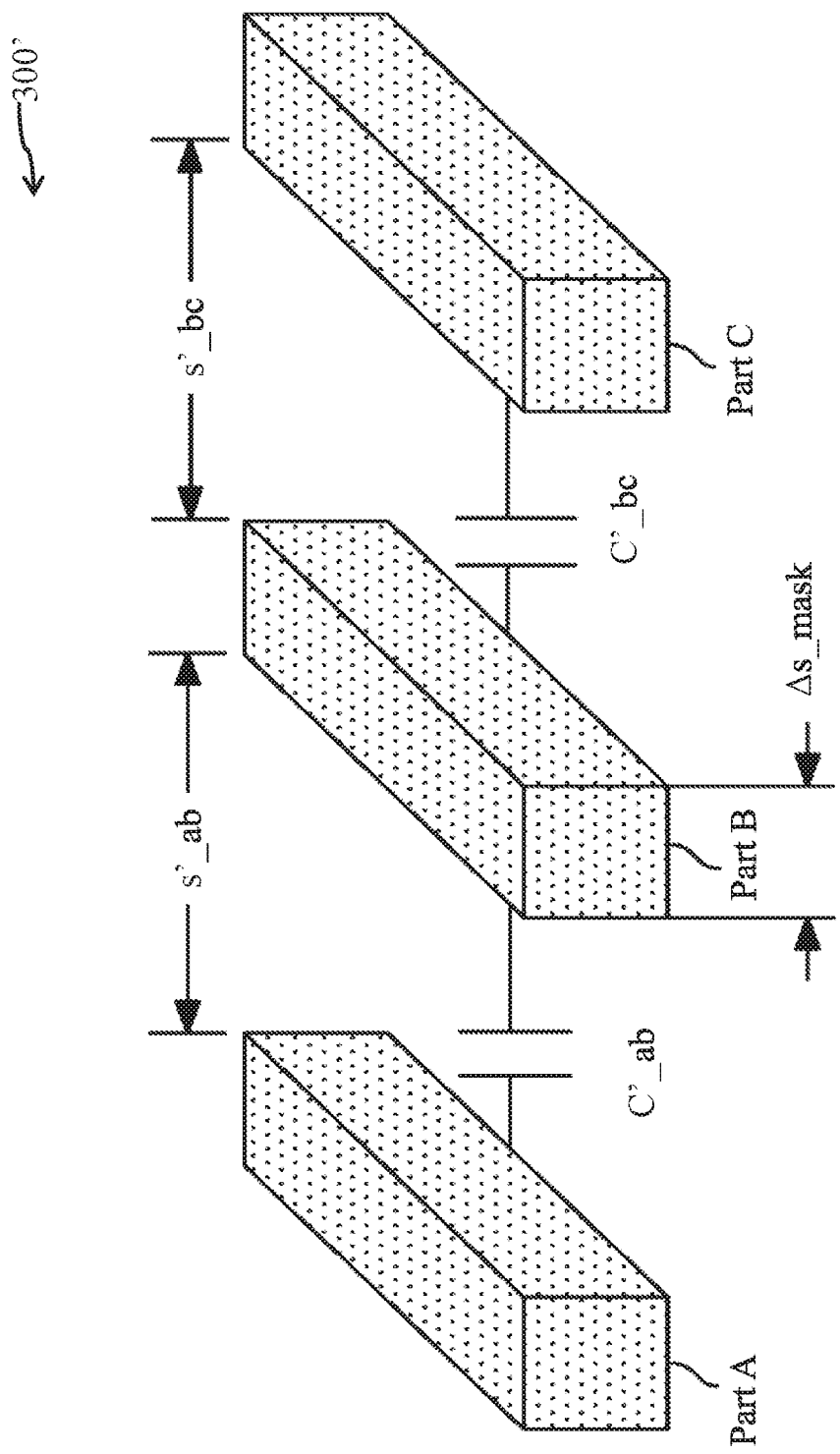
FIG. 3B is a cross-sectional view of mask pattern in accordance with one or more embodiments.

FIG. 3B is a cross-sectional view of mask pattern 300' in accordance with one or more embodiments. Mask pattern 300' is an embodiment of mask pattern 300 shown in FIG. 3A. In comparison with mask pattern 300 (shown in FIG. 3A), semiconductor element part B of mask pattern 300' is shifted by shift Δs_mask. In comparison with mask pattern 300 (shown in FIG. 3A), the capacitance between semiconductor element part A and semiconductor element part B is changed to C'_ab. In comparison with mask pattern 300 (shown in FIG. 3A), the capacitance between semiconductor element part B and semiconductor element part C is changed to C'_bc.

In some embodiments, the change in the capacitance from capacitance C_ab to C'_ab is expressed as the capacitance color sensitivity multiplied by the shift Δs_mask. In some embodiments, the change in the capacitance from capacitance C_bc to C'_bc is expressed as the capacitance color sensitivity multiplied by the shift Δs_mask.

Figure 4:
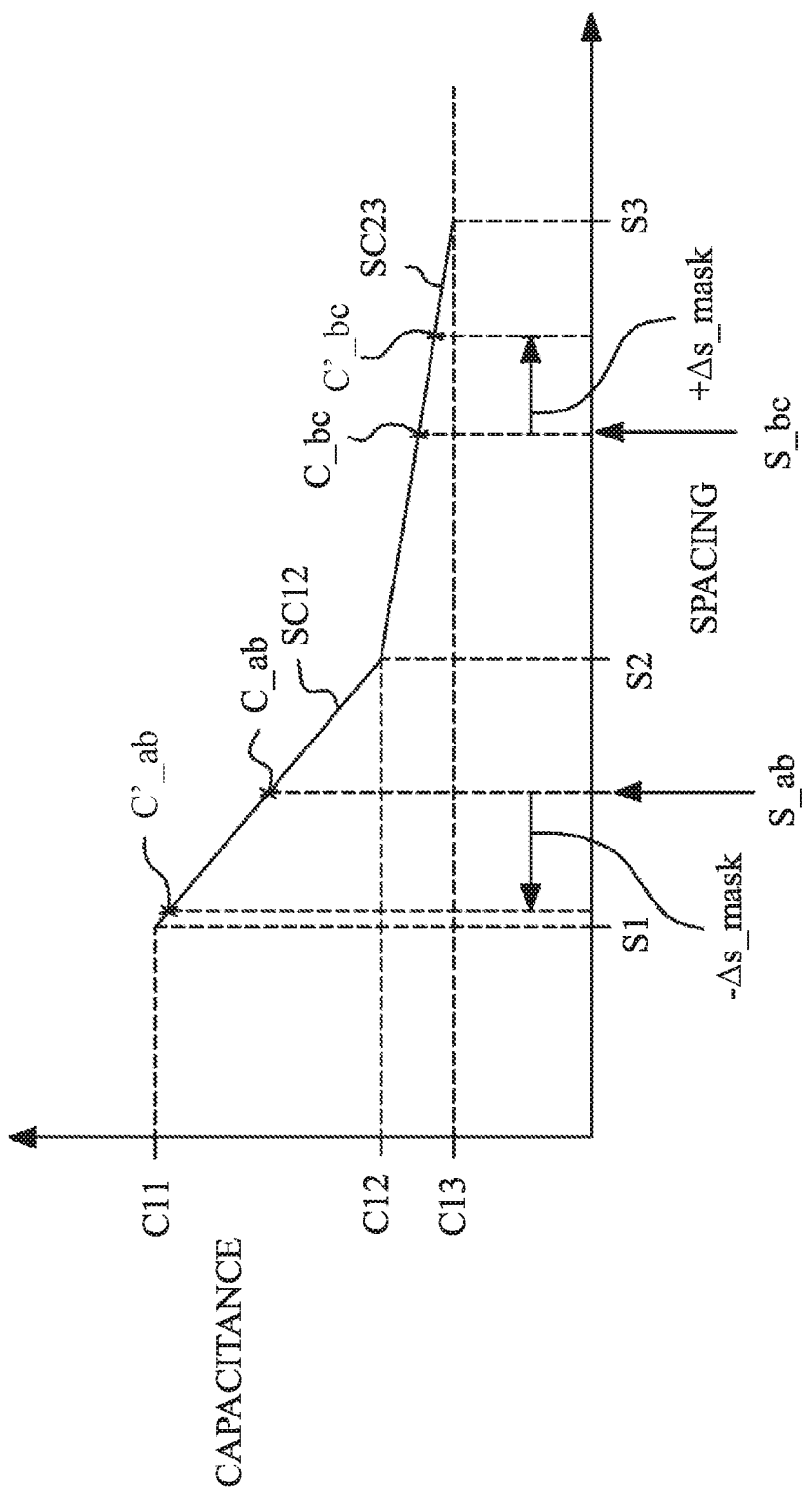
FIG. 4 is a graph of capacitances between two or more semiconductor elements in accordance with one or more embodiments.

FIG. 4 is a graph of capacitances between two or more semiconductor elements in accordance with one or more embodiments. FIG. 4 represents the capacitance between semiconductor element part A and part B as a function of spacing S.

Accordingly, as shown in FIG. 4, the new capacitance C'_ab is expressed in formula 1 and the new capacitance C'_bc is expressed in formula 2:

$$C'\_ab = C\_ab + SC12*(-\Delta s\_mask) \quad (1)$$

$$C'\_bc = C\_bc + SC23*(+\Delta s\_mask) \quad (2)$$

SC12 is the capacitance color sensitivity (as shown in FIG. 2D) associated with spacing range S1~S2, which the new spacing S'_ab is within, and SC23 is the capacitance color sensitivity associated with spacing range S2~S3, which the new spacing S'_bc is within.

In some embodiments, shift Δs_mask includes the shift Δx in the x direction, the shift Δy in the y direction, and the shift Δz in the z direction, such that the capacitance C between two patterns is expressed in formula 3a, formula 3b and formula 3c as:

$$C = f_{ij}(S_0 + \Delta S_{mask\_ij})|_{i,j} = C_0 + \partial C/\partial S(\Delta S_{mask\_ij})|_{i,j} \quad (3a)$$

$$C = C_0 + (Sc_{ij} * \Delta S_{mask\_ij})|_{i,j} \quad (3b)$$

$$C = C_0 + (Scx_{ij} * \Delta X_{mask\_ij})|_{i,j} + (Scy_{ij} * \Delta Y_{mask\_ij})|_{i,j} + (Scz_{ji} * \Delta Z_{mask\_ij})|_{i,j} \quad (3c)$$

Mask index i=A or B, and mask index j=A or B, $\Delta X_{mask\_ij}$ is the shift in the x direction, $Scx_{ij}$ is the capacitance color sensitivity for mask index i and mask index j, $\Delta Y_{mask\_ij}$ is the mask shift n the y direction. $Scy_{ij}$ is the capacitance color sensitivity for mask index i and mask index j, $\Delta Z_{mask\_ij}$ is the shift in the z direction, $Scz_{ij}$ is the capacitance color sensitivity for mask index i and mask index j, and $C_0$ is the capacitance if no mask shift occurs. In some embodiments, formula 3 is expressed in Cartesian coordinates (as shown in formula 3c). In some embodiments, formula 3 is expressed in other coordinate systems such polar and spherical. In some embodiments, formula 3 is further modified to be expressed in terms of the ratio of the magnification shift and the angular shift is represented by rotation angle α. Mask index i and mask index j correspond to the pair of mask patterns that affect the capacitance of the affected semiconductor elements.

In some embodiments, the capacitances (determined from formula 3) between two or more semiconductor element part A, semiconductor element part B and semiconductor element part C (as shown in FIG. 2A) and the corresponding capacitance color sensitivities 206 (as shown in FIG. 2D) associated with each pattern mask (e.g., mask pattern color alpha or mask pattern color beta) are stored in one or more techfiles (as shown in FIG. 10).

In some embodiments, in order to determine one or more capacitances between the semiconductor elements shown in FIG. 2A, the following example illustrates an application of formula 3. For example, if mask pattern color alpha is shifted by ΔSmask_ij, then semiconductor element part B is shifted by ΔSmask_ij. For example, a change to the dimensions of semiconductor element part B will both affect the capacitive coupling from semiconductor element part B to semiconductor element part A and the capacitive coupling from semiconductor element part B to semiconductor element part C.

In this example, the capacitive coupling from semiconductor element B to semiconductor element part A is expressed as $C_{coupling}$ BA. Furthermore, semiconductor element part B is part of mask pattern color alpha and semiconductor element part A is part of mask pattern color alpha. Therefore, in this example, both semiconductor elements (part A and part B) are part of the same pattern mask (i.e., mask color alpha) and the capacitance color sensitivity Scij corresponds to sensitivity $Sc_{AlphaAlpha}$. In this example, the capacitance color sensitivity $Sc_{AlphaAlpha}$ is located in a color bias table for mask pair Alpha-Alpha as shown in FIG. 2D.

In this example, the capacitive coupling from semiconductor element part B to semiconductor element part C is expressed as $C_{coupling}$ BC. Furthermore, semiconductor element part B is part of mask pattern color alpha, and semiconductor element part C is part of mask pattern color beta. Therefore, in this example, semiconductor elements (part B and part C) are part of different pattern masks (e.g., semiconductor element part B is part of pattern mask alpha and semiconductor element part C is part of pattern mask beta). In this example, the capacitance color sensitivity Scij corresponds to sensitivity $Sc_{AlphaBeta}$. In this example, the capacitance color sensitivity $Sc_{AlphaBeta}$ is located in a color bias table for mask pair Alpha-Beta (not shown). In some embodiments, the color bias table for mask pair Alpha-Beta and capacitance color sensitivity $Sc_{AlphaBeta}$ is similar to the table shown in FIG. 2D except the entries are for mask pair Alpha-Beta.

FIG. 5A is a schematic view of data in a techfile 502a in accordance with one or more embodiments. Techfile 502a is an embodiment of techfile 202 (shown in FIG. 2B). In comparison with techfile 202 (shown in FIG. 2B), techfile 502a is a color bias techfile for resistance associated with mask pair "Alpha-Alpha-Beta." In some embodiments, techfile 502a pertains to the mask patterns 200 shown in FIG. 2A.

Techfile 502a includes the resistance between semiconductor part A and part B as a function of spacing S and width W. In some embodiments, a change in the widths W or spacing S results in a change in the resistance for semiconductor element part A, part B or part C. For example, if width W is equal to W1 and spacing S is equal to S1, then the respective resistance is R11. For example, if width W is equal to W1 and spacing S is equal to S2, then the respective resistance is R12. In some embodiments, the contents in the techfiles are retrieved in the design tool simulation shown in FIG. 11, in some embodiments, the resistances shown in FIG. 5A are for semiconductor element part B, which is part of mask pattern color alpha.

In some embodiments, a shift in the mask pattern affects both the spacing and the width between two or more semiconductor elements; and each of the semiconductor elements are associated with one or more mask patterns. In some embodiments, each color bias techfile for resistance is associated with three mask patterns that affect the resistance. For example, the color bias techfile for resistance shown in FIG. 5A is associated with masks "Alpha-Alpha-Beta." In some embodiments, a similar color bias techfile for resistance is associated with masks "Alpha-Alpha-Alpha." In some embodiments, a similar color bias techfile for resistance is associated with masks "Beta-Alpha-Alpha." In some embodiments, a similar color bias techfile for resistance is associated with masks "Beta-Alpha-Beta." In some embodiments, a similar color bias techfile for resistance is associated with masks "Alpha-Beta-Alpha." In some embodiments, a similar color bias techfile for resistance is associated with masks "Alpha-Beta-Beta." In some embodiments, a similar color bias techfile for resistance is associated with masks "Beta-Beta-Alpha." In some embodiments, a similar color bias techfile for resistance is associated with masks "Beta-Beta-Beta." In some embodiments, the number of color bias techfiles for a resistance is equal to $N^3$, where N is the number of mask patterns in a semiconductor layer. For example, for N equal to two mask patterns, eight mask pattern combinations and eight color bias techfiles for resistance result.

FIG. 5B is a schematic view of data in a techfile 502b in accordance with one or more embodiments. Techfile 502b is an embodiment of techfile 202 (shown in FIG. 2B). In comparison with techfile 202 (shown in FIG. 2B), techfile 502b is a color bias techfile for inductance associated with mask pair "Alpha-Alpha." In some embodiments, techfile 502b pertains to the mask patterns 200 shown in FIG. 2A.

Techfile 502b includes the mutual inductance between semiconductor part A and part B as a function of spacing S and width W. In some embodiments, a change in the widths W or spacing S results in a change in the inductance for semiconductor element part A, part B or part C. For example, if width W is equal to W1 and spacing S is equal to S1, then the respective inductance is L11. For example, if width W is equal to W1 and spacing S is equal to S2, then the respective inductance is L12. In some embodiments, the contents in the techfiles are retrieved in the design tool simulation shown in FIG. 11. In some embodiments, the inductances shown in FIG. 5B are for semiconductor elements part A and part B which are both part of mask pattern color alpha.

In some embodiments, a shift in the mask pattern affects both the spacing and the inductance between two semiconductor elements; and each of the semiconductor elements are associated with one or more mask patterns. In some embodiments, each color bias techfile for inductance is associated with a pair of mask patterns that affect the inductance. For example, the color bias techfile shown in FIG. 5B is associated with mask pair "Alpha-Alpha." In some embodiments, a similar color bias techfile for inductance is associated with mask pair "Alpha-Beta." In some embodiments, a similar color bias techfile for inductance is associated with mask pair "Beta-Beta." In some embodiments, a similar color bias techfile for inductance is associated with mask pair "Beta-Alpha." In some embodiments, the number of color bias techfiles for an inductance is equal to $N^2$, where N is the number of mask patterns in a semiconductor layer. For example, for N equal to two mask patterns, four mask pattern combinations and four color bias techfiles for inductance result.

FIG. 6A is a graph of resistances for one or more semiconductor elements in accordance with one or more embodiments. FIG. 6A represents the resistance of semiconductor element part B between node #b1 and node #b2 (shown in FIG. 2) as a function of spacing S. As shown in FIG. 6A the curve 604a corresponds to the resistance of semiconductor element part B. However, the number of entries in techfile 502a (shown in FIG. 5A) do not contain each of the data points in curve 604a. For example, if semiconductor element part A and part B are separated by spacing S', and spacing S' is positioned between spacing S1 and spacing S2, then the resistance corresponding to spacing S' is not retrieved directly from the techfiles shown in FIG. 5A. In some embodiments, the resistance corresponding to spacing S' is determined from a color resistance sensitivity.

FIG. 6B is a graph of inductances between two or more semiconductor elements in accordance with one or more embodiments. FIG. 6B represents the inductance between semiconductor element part A and part B as a function of spacing S. As shown in FIG. 6B, the curve 604b corresponds to the inductance of semiconductor element part A. However, the number of entries in techfile 202 (shown in FIG. 5B) do not contain each of the data points in curve 604b. For example, if semiconductor element part A and part B are separated by spacing S', and spacing S' is positioned between spacing S1 and spacing S2, then the inductance corresponding to spacing S' is not retrieved directly from the techfiles shown in FIG. 5B. In some embodiments, the inductance corresponding to spacing S' is determined from a color inductance sensitivity.

FIG. 7A is a schematic view of data in a techfile 706a in accordance with one or more embodiments. Techfile 706a includes the bias resistance color sensitivities for semiconductor element part A, part B or part C as a function of spacing S and width W. In some embodiments, the resistance color sensitivity is related to the respective widths of semiconductor element part A, part B or part C. As shown in FIG. 7A, the resistance color sensitivity (R12-R11)/(S2-S1) corresponds to the slope SR12 (as shown in FIG. 6A as the solid line positioned between spacings S1 and S2). As shown in FIG. 7A, the resistance color sensitivity (R13-R12)/(S3-S2) corresponds to the slope SR23 (as shown in FIG. 6A as the solid line positioned between spacings S2 and S3). Therefore, if a spacing is within the ranges defined between S1 and S2, or between the spacing ranges S2 and S3, the respective resistance is calculated from the resistance color sensitivities. The concept is further explained in FIG. 8. FIG. 9A and Equation 6. In some embodiments, the resistance sensitivities shown in FIG. 7A are for semiconductor element part B, which is part of mask pattern color alpha.

In some embodiments, each color bias sensitivity techfile for resistance is associated with three mask patterns that affect the resistance. For example, the color bias sensitivity techfile for resistance shown in FIG. 7A is associated with masks "Alpha-Alpha-Beta." In some embodiments, a similar color bias sensitivity techfile for resistance is associated with masks "Alpha-Alpha-Alpha." In some embodiments, a similar color bias sensitivity techfile for resistance is associated with masks "Beta-Alpha-Alpha." In some embodiments, a similar color bias sensitivity techfile for resistance is associated with masks "Beta-Alpha-Beta." In some embodiments, a similar color bias sensitivity techfile for resistance is associated with masks "Alpha-Beta-Alpha." In some embodiments, a similar color bias sensitivity techfile for resistance is associated with masks "Alpha-Beta-Beta." In some embodiments, a similar color bias sensitivity techfile for resistance is associated with masks "Beta-Beta- Alpha." In some embodiments, a similar color bias sensitivity techfile for resistance is associated with masks "Beta-Beta-Beta." in some embodiments, the number of color bias sensitivity techfiles for a resistance is equal to $N^3$, where N is the number of mask patterns in a semiconductor layer. For example for N equal to two mask patterns, eight mask pattern combinations and eight color bias sensitivity techfiles for resistance result.

FIG. 7B is a schematic view of data in a techfile 706b in accordance with one or more embodiments. Techfile 706b includes the bias inductance color sensitivities between semiconductor element part A and part B as a function of spacing S and width W. In some embodiments, the inductance color sensitivity is related to the respective widths of semiconductor element part A or part B. As shown in FIG. 7B, the color sensitivity (L12-L11)/(S2-S1) corresponds to the slope SL12 (as shown in FIG. 6B as the solid line positioned between spacings S1 and S2). As shown in FIG. 7B, the color sensitivity (L13-L12)/(S3-S2) corresponds to the slope SL23 (as shown in FIG. 6B as the solid line positioned between spacings S2 and S3). Therefore, if a spacing is within the ranges defined between S1 and S2, or between the spacing ranges S2 and S3, the respective inductance is calculated from the inductance color sensitivities. The concept is further explained in FIG. 8, FIG. 9B and Equation 9. In some embodiments, the inductance sensitivities shown FIG. 7B are for semiconductor element part A and part B, which are each part of mask pattern color alpha.

In some embodiments, each color bias sensitivity techfile for inductance is associated with a pair of mask patterns that affect the inductance. For example, the color bias sensitivity techfile shown in FIG. 7B is associated with mask pair "Alpha-Alpha." In some embodiments, a similar color bias sensitivity techfile for inductance is associated with mask pair "Alpha-Beta." In some embodiments, a similar color bias sensitivity techfile for inductance is associated with mask pair "Beta-Beta." In some embodiments, a similar color bias sensitivity techfile for inductance is associated with mask pair "Beta-Alpha." In some embodiments, the number of color bias sensitivity techfiles for an inductance is equal to $N^2$, where N is the number of mask patterns in a semiconductor layer. For example, for N equal to two mask patterns, four mask pattern combinations results in four color bias sensitivity techfiles for an inductance.

Figure 8:
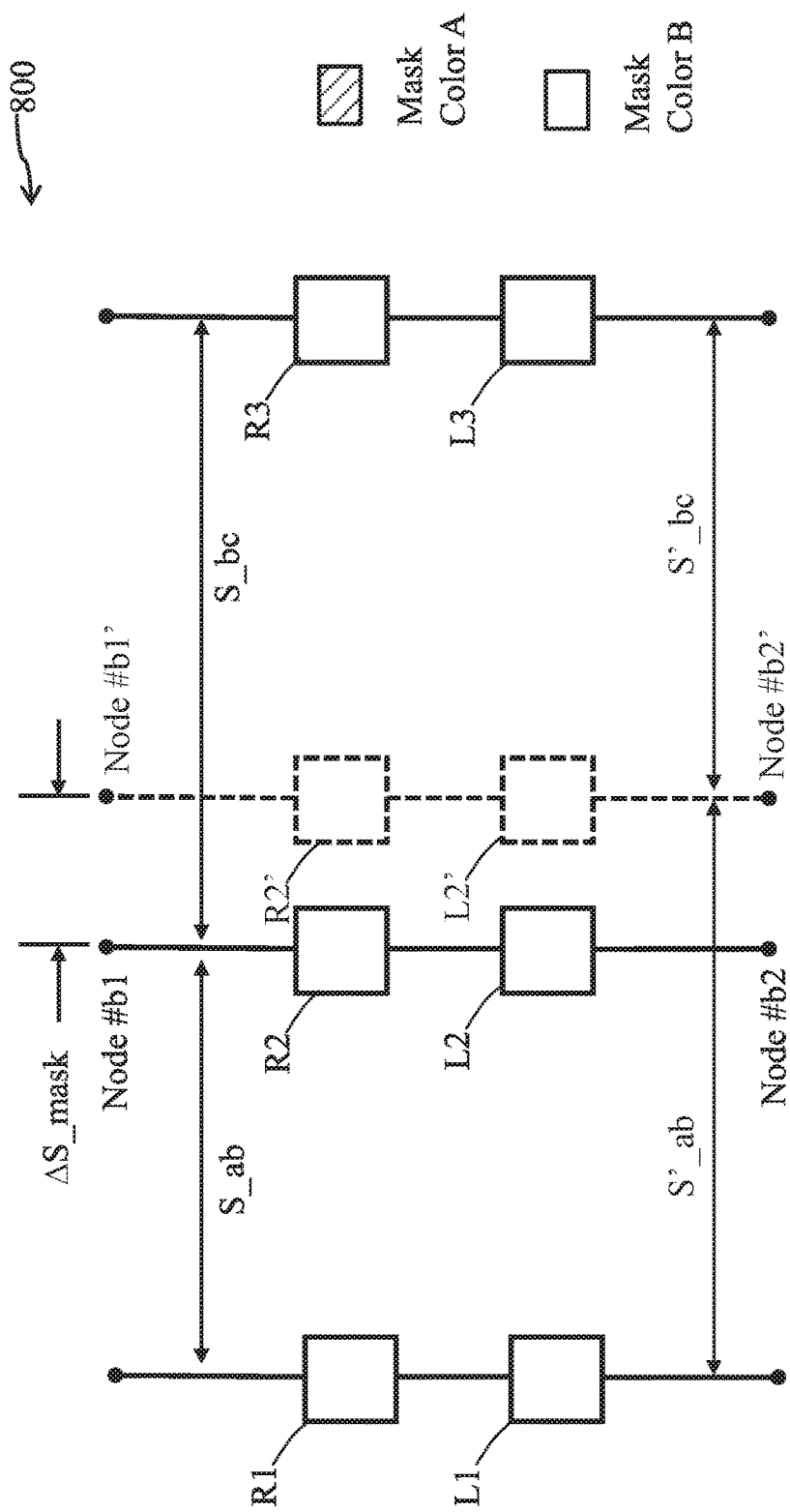
FIG. 8 is a schematic diagram of a mask pattern in accordance with one or more embodiments.
Figure 9A:
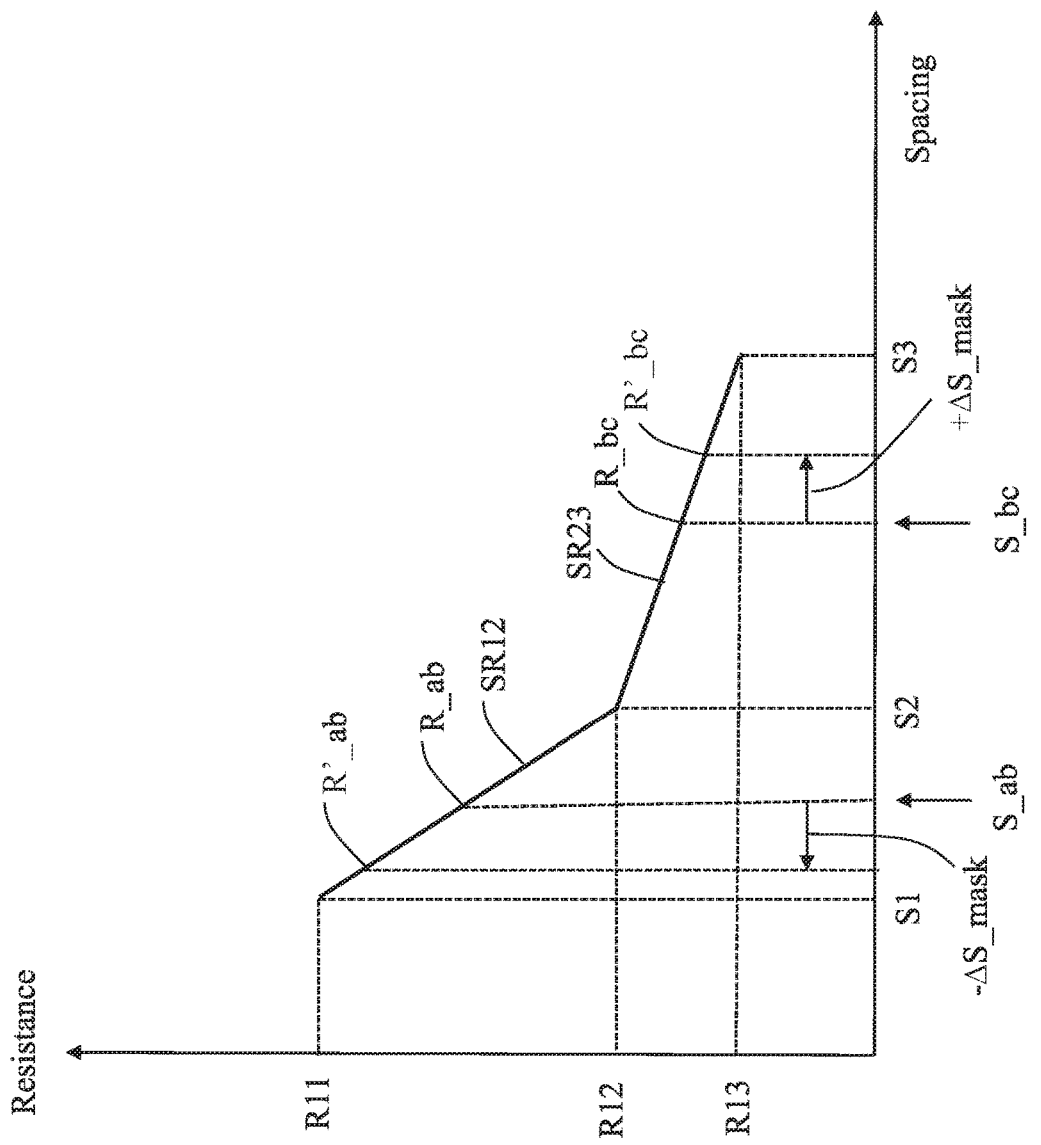
FIG. 9A is a graph of resistances for a semiconductor element in accordance with one or more embodiments.

FIG. 8 is a schematic diagram of mask pattern 800 in accordance with one or more embodiments. Mask pattern 800 is an embodiment of mask pattern 200 shown in FIG. 2A. In comparison with mask pattern 200 (shown in FIG. 2A), mask pattern 800 is an equivalent circuit of mask pattern 200. Mask pattern 800 comprises semiconductor element part A, semiconductor element part B and semiconductor element part C.

Semiconductor element part A comprises resistor R1 and Inductor L1. Semiconductor element part B comprises resistor R2 and Inductor L2. Semiconductor element part C comprises resistor R3 and Inductor L3.

Semiconductor element part A and semiconductor element part B are separated by spacing S_ab. Semiconductor element part B and semiconductor element part C are separated by spacing S_bc.

Semiconductor element part B is shifted by shift $\Delta s\_mask$, such that semiconductor element part A and semiconductor element part B are separated by spacing S'_ab and semiconductor element part B and semiconductor element part C are separated by spacing S'_bc. Also, the shifting of the semiconductor element part B results in the resistance R2 being changed to R2' and the inductance L2 being changed to L2'.

In some embodiments, the resistance R2 is expressed as R_bc and the resistance R2' is expressed as R_bc'. In some embodiments, the resistance R2 is expressed as R_ab and the resistance R2' is expressed as R_ab'. In some embodiments, the change in the resistance from resistance R_ab to R'_ab is expressed as the resistance color sensitivity multiplied by the shift $\Delta s\_mask$. In some embodiments, the change in the resistance from resistance R_bc to R'_bc is expressed as the resistance color sensitivity multiplied by the shift $\alpha s\_mask$.

In some embodiments, the inductance L2 is expressed as L_bc and the inductance L2' is expressed as In some embodiments, the inductance L2 is expressed as L_ab and the inductance L2' is expressed as L_ab'. In some embodiments, the change in the capacitance from inductance L_ab to L'_ab is expressed as the inductance color sensitivity multiplied by the shift $\Delta s\_mask$. In some embodiments, the change in the inductance from inductance L_bc to L'_bc is expressed as the inductance color sensitivity multiplied by the shift $\Delta s\_mask$.

FIG. 9A is a graph of resistances for a semiconductor element in accordance with one or more embodiments. FIG. 9A represents the resistance of semiconductor element part A, semiconductor element part B or semiconductor element part C as a function of spacing S.

Accordingly, as shown in FIG. 9A, the new resistance R'_ab is expressed in formula 4 and the new resistance R'_bc is expressed in formula 5:

$$R'\_ab = R\_ab + SR12 * (-\Delta s\_\text{mask}) \quad (4)$$

$$R'\_bc = R\_bc + SR23 * (+\Delta s\_\text{mask}) \quad (5)$$

SR12 is the resistance color sensitivity (as shown in FIG. 7A) associated with spacing range S1~S2, which the new spacing S'_ab is within, and SR23 is the resistance color sensitivity associated with spacing range S2~S3, which the new spacing S'_bc is within.

In some embodiments, shift $\Delta s\_mask$ includes the shift $\Delta x$ in the x direction, the shift $\Delta y$ in the y direction, and the shift $\Delta z$ in the z direction, such that the resistance R of a pattern is expressed in formula 6a, formula 6b and formula 6c as:

$$R = f_{ijk}(S_0 + \Delta S_{mask\_ijk})|_{i,j,k} = R_0 + \partial R/\partial S(\Delta S_{mask\_ijk})|_{i,j,k} \quad (6a)$$

$$R = R_0 + (Sc_{ijk} * \Delta S_{mask\_ijk})|_{i,j,k} \quad (6b)$$

$$R = R_0 + (Scx_{ijk} * \Delta X_{mask\_ijk})|_{i,j,k} + (Scy_{ijk} * \Delta Y_{mask\_ijk})|_{i,j,k} + (Scz_{ijk} * \Delta Z_{mask\_ijk})|_{i,j,k} \quad (6c)$$

Mask index i=A or B mask index j=A or B, mask index k=A or B, $\Delta X_{mask\_ij}$ is the shift in the x direction, $Scx_{ijk}$ is the resistance color sensitivity for mask index i, mask index j and mask index k, $\Delta Y_{mask\_ijk}$ is the mask shift in the y direction, $Scy_{ijk}$ is the resistance color sensitivity for mask index i, mask index j and mask index k, $\Delta Z_{mask\_ijk}$ is the shift in the z direction, $Scz_{ijk}$ is the resistance color sensitivity for mask index i, mask index j and mask index k, and $R_0$ is the resistance if no mask shift occurs. In some embodiments, formula 6 is expressed in Cartesian coordinates (as shown in formula 6c). In some embodiments, formula 6 is expressed in other coordinate systems including polar and spherical. In some embodiments, formula 6 is further modified to be expressed in terms of the ratio of the magnification shift and the angular shift is represented by rotation angle α. Mask index i, mask index j and mask index k correspond to the mask patterns that affect the resistance of the affected semiconductor elements.

In some embodiments, the resistances (determined from formula 6) of semiconductor element part A, semiconductor element part B and semiconductor element part C (as shown in FIG. 5A) and the corresponding resistance color sensitivities 706a (as shown in FIG. 7A) associated with each mask pattern (e.g., mask pattern color alpha or mask pattern color beta) are stored in one or more techfiles (as shown in FIG. 10.

In some embodiments, in order to determine one or more resistances of the semiconductor elements shown in FIG. 2A, the following example illustrates an application of formula 6. For example, if mask pattern color alpha is shifted by ΔSmask_ij, then semiconductor element part B is shifted by ΔSmask_ij. For example, a change to the dimensions of semiconductor element part B will both affect the spacing from semiconductor element part B to semiconductor element part A and the spacing from semiconductor element part B to semiconductor element part C.

In this example, the resistance of semiconductor element part B from node #b1 to node #b2 is expressed as R1 b#1 b#2. Furthermore, semiconductor element part B is part of mask pattern color alpha. However, a change of the spacing S or width W of semiconductor element part B also affects the spacing S or width W of adjacent semiconductor elements (i.e. semiconductor element part A and semiconductor element part C). Therefore, each of the masks to which semiconductor element part A and semiconductor element part C are associated with are utilized in the resistance coloring sensitivity formulas (i.e. formulas 4, 5 and 6). In some embodiments, mask element j corresponds to the mask pattern of semiconductor element part B for which resistance R1 b#1 b#2 is being determined. In this example, mask element i corresponds to the mask pattern of semiconductor element part A and mask element k corresponds to the mask pattern of semiconductor element part C.

In this example, both semiconductor elements (part A and part B) are part of the same pattern mask (i.e., mask pattern color alpha) and the semiconductor element part C is part of a different pattern mask (i.e., mask pattern color beta). Therefore, the resistance color sensitivity Scijk corresponds to sensitivity $SC_{AlphaAlphaBeta}$. In this example, the resistance color sensitivity $Sc_{AlphaAlphaBeta}$, is located in a color bias table for mask pair Alpha-Alpha-Beta as shown in FIG. 7A.

Figure 9B:
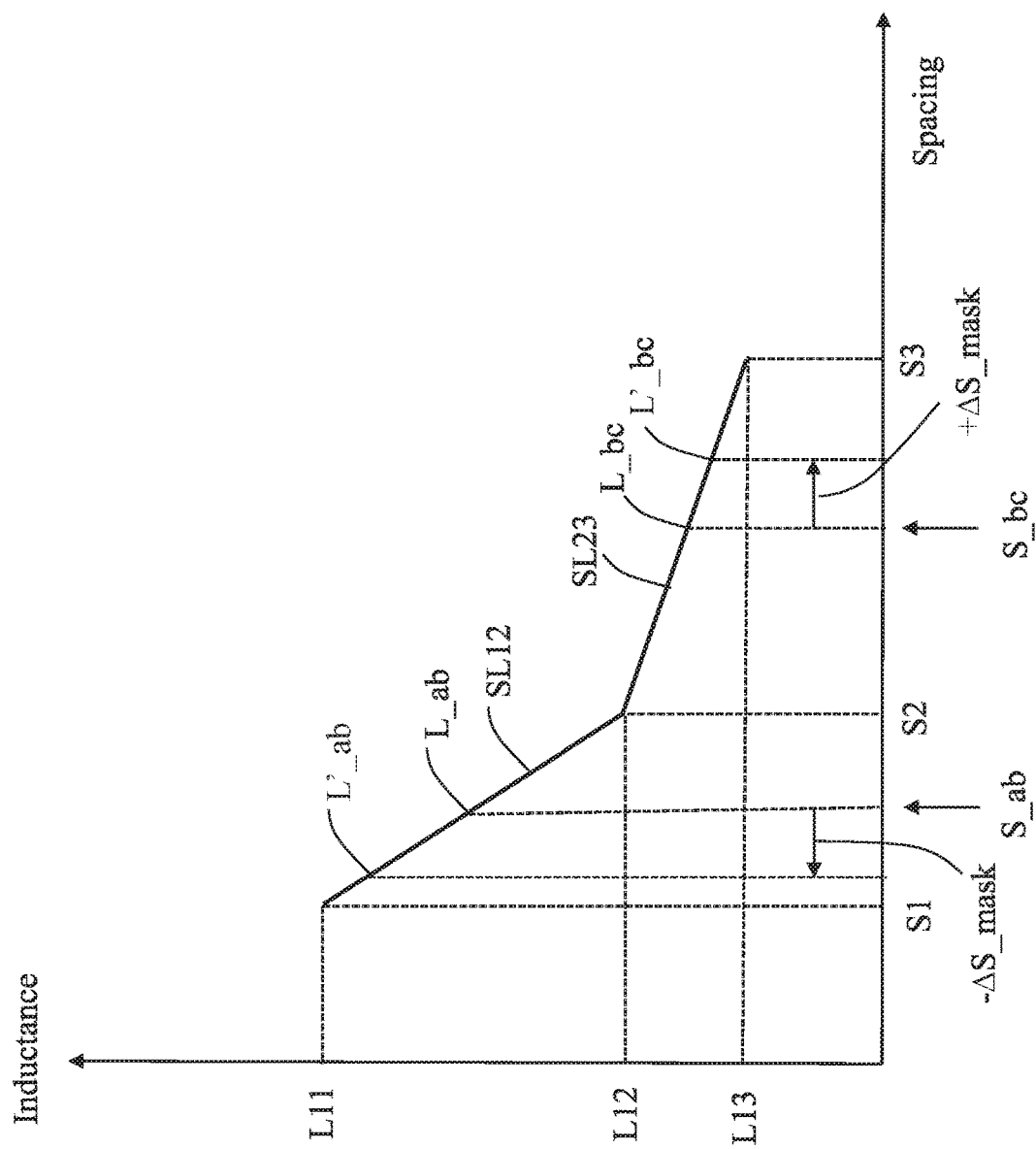
FIG. 9B is a graph of inductances between two or more semiconductor elements in accordance with one or more embodiments.

FIG. 9B is a graph of inductances between two or more semiconductor elements in accordance with one or more embodiments. FIG. 9B represents the inductance between semiconductor element part A and semiconductor element part B as a function of spacing S.

Accordingly, as shown in FIG. 9B, the new inductance L'_ab is expressed in formula 7 and the new inductance L'_bc is expressed in formula 8:

$$L'\_ab = L\_ab + SL12*(-\Delta s\_mask) \qquad (7)$$

$$L'\_bc = L\_bc + SL23*(+\Delta s\_mask) \qquad (8)$$

SL12 is the inductance color sensitivity (as shown in FIG. 7B) associated with spacing range S1~S2, which the new spacing S'_ab is within, and SL23 is the inductance color sensitivity associated with spacing range S2~S3, which the new spacing S'_bc is within.

In some embodiments, shift Δs_mask includes the shift Δx in the direction, the shift Δy in the y direction, and the shift Δz in the z direction, such that the inductance L between two patterns is expressed in formula 9a, formula 9b and formula 9c as:

$$L = f_{ij}(S_0 + \Delta S_{mask\_ij})|_{i,j} = L_0 + \partial L/\partial S(\Delta S_{mask\_ij})|_{i,j} \qquad (9a)$$

$$L = L_0 + (Sc_{ij} * \Delta S_{mask\_ij})|_{i,j} \qquad (9b)$$

$$L = L_0 + (Scx_{ij} * \Delta X_{mask\_ij})|_{i,j} + (Scy_{ij} * \Delta Y_{mask\_ij})|_{i,j} + (Scz_{ij} * \Delta Z_{mask\_ij})|_{i,j} \qquad (9c)$$

Mask index=A or B, and mask index j=A or B, $\Delta X_{mask\_ij}$ is the shift in the x direction, $Scx_{ij}$ is the inductance color sensitivity for mask index i and mask index j, $\Delta Y_{mask\_ij}$ is the mask shift in the v direction, $Scy_{ij}$ is the inductance color sensitivity for mask index i and mask index j, $\Delta Z_{mask\_ij}$ is the shift in the z direction, $Scz_{ij}$ is the inductance color sensitivity for mask index i and mask index j, and $L_0$ is the inductance if no mask shift occurs. In some embodiments, formula 9 is expressed in Cartesian coordinates (as shown in formula 9c). In some embodiments, formula 9 is expressed in other coordinate systems such polar and spherical. In some embodiments, formula 9 is further modified to be expressed in terms of the ratio of the magnification shift and the angular shift is represented by rotation angle α. Mask index i and mask index j correspond to the pair of mask patterns that affect the inductance of the affected semiconductor elements.

In some embodiments, the inductances (determined from formula 9) between two or more of semiconductor element part A, semiconductor element part B and semiconductor element part C (as shown in FIG. 2A) and the corresponding inductance color sensitivities 706b (as shown in FIG. 7B) associated with each pattern mask (e.g., mask pattern color alpha or mask pattern color beta) are stored in one or more techfiles (as shown in FIG. 10).

In some embodiments, in order to determine one or more inductances between the semiconductor elements shown in FIG. 2A, the following example illustrates an application of formula 9. For example, if mask pattern color alpha is shifted by ΔSmask_ij, then semiconductor element part B is shifted by ΔSmask_ij. For example, a change to the dimensions of semiconductor element part B will both affect the inductance from semiconductor element part B to semiconductor element part A and the inductance from semiconductor element part B to semiconductor element part C.

In this example, the inductance from semiconductor element part B to semiconductor element part A is expressed as L1 BA. Furthermore, semiconductor element part B is part of mask pattern color alpha and semiconductor element part A is part of mask pattern color alpha. Therefore, in this example, both semiconductor elements (part A and part B) are part of the same pattern mask (i.e., mask color alpha) and the inductance color sensitivity Scij corresponds to sensitivity $Sc_{AlphaAlpha}$. In this example, the inductance color sensitivity $Sc_{AlphaAlpha}$, is located in a color bias table for mask pair Alpha-Alpha as shown in FIG. 7B.

In this example, the inductance from semiconductor element part B to semiconductor element part C is expressed as L1 BC. Furthermore, semiconductor element part B is part of mask pattern color alpha, and semiconductor element part C is part of mask pattern color beta. Therefore, in this example, semiconductor elements (part B and part C) are part of different pattern masks (e.g., semiconductor element part B is part of pattern mask alpha and semiconductor element part C is part of pattern mask beta). In this example, the inductance color sensitivity Scij corresponds to sensitivity $Sc_{AlphaBeta}$. In this example, the inductance color sensitivity $Sc_{AlphaBeta}$ is located in a color bias table for mask pair Alpha-Beta (not shown). In some embodiments, the color bias table for mask pair Alpha-Beta and inductance color sensitivity $Sc_{AlphaBeta}$ is similar to the table shown in FIG. 7B except the entries are for mask pair Alpha-Beta.

FIG. 10 is a view of a netlist 1000 in accordance with one or more embodiments. Netlist 1000 comprises one or more capacitances, one or more capacitance sensitivities, one or more resistances, one or more resistance sensitivities, one or more inductances, one or more inductance sensitivities. In some embodiments, a portion of the netlist 1000 is extracted from one or more mask shift aware techfiles (i.e. as shown in FIG. 2B, FIG. 2D, FIG. 5A, FIG. 5B, FIG. 7A and FIG. 7B).

As shown in FIG. 10, the line starting with index "1" indicates a range of mask shifts in metal layer 1 (M1). For example, the minimum mask shift in the x direction is −0.01 μm and the maximum mask shift in the x direction is 0.03 μm.

As shown in FIG. 10, the line starting with index "2" indicates a range of mask shifts in metal layer 1 (M1). For example, the minimum mask shift in the y direction is 0.01 μm and the maximum mask shift in the y direction is 0.02 μm.

In some embodiments, a different netlist format includes different definitions, such as 1 sigma, 2 sigmas, 3 sigmas, and the like, wherein 3 sigma may have the exemplary value of 0.03 μm. In some embodiments, the maximum mask shifts are the possible (expected) maximum mask shifts that may occur for a given design. In some embodiments, the expected respective mask shifts, when the layout of the respective integrated circuit is implemented on an actual semiconductor wafer, will not exceed these maximum mask shift values. In some embodiments, the maximum shifts are used to calculate the maximum performance variation.

As shown in FIG. 10, the netlist entry "C1 B A 6.6e-16 *$Scx_{AlphaAlpha}$ 1:−0.005 2:0.015 *$Scy_{AlphaAlpha}$ 1:−0.003 2:0.013" signifies that the capacitance C1 between nodes B and A is 6.6e-16 farads if no mask shift occurs, the minimum sensitivity of capacitance in layer M1 in the x direction is −0.005, the maximum sensitivity of capacitance in layer M1 in the x direction is 0.015, the minimum sensitivity of capacitance in layer M1 in the y direction is −0.003 and the maximum sensitivity of capacitance in layer M1 in the y direction is 0.013.

As shown in FIG. 10, the netlist entry "C2 B C 8.8e-16 $Scx_{AlphaBeta}$ 1:−0.005 2:0.015 *$Scy_{AlphaBeta}$ 1:−0.003 2:0.013" signifies that the capacitance C2 between nodes B and C is 8.8e-16 farads if no mask shift occurs, the minimum sensitivity of capacitance in layer M1 in the x direction is −0.005, the maximum sensitivity of capacitance in layer M1 in the x direction is 0.015, the minimum sensitivity of capacitance in layer M1 in the y direction is −0.003 and the maximum sensitivity of capacitance in layer M1 in the y direction is 0.013.

As shown in FIG. 10, the netlist entry "R1 #b1 #b2 66 *$Scx_{AlphaAlphaBeta}$ 1:−0.005 2:0.015 *$Scy_{AlphaAlphaBeta}$ 1:−0.003 2:0.013" signifies that the resistance R1 between nodes b#1 and b#2 is 66 ohms if no mask shift occurs, the minimum sensitivity of resistance in layer M1 in the x direction is −0.005, the maximum sensitivity of resistance in layer M1 in the x direction is 0.015, the minimum sensitivity of resistance in layer M1 in the y direction is −0.003 and the maximum sensitivity of resistance in layer M1 in the y direction is 0.013.

As shown in FIG. 10, the netlist entry "L1 B A 6.6e-16 *$Slx_{AlphaAlpha}$ 1:−0.005 2:0.015 *$Sly_{AlphaAlpha}$ 1:−0.003 2:0.013" signifies that the inductance L1 between nodes B and A is 6.6e-16 henries if no mask shift occurs, the minimum sensitivity of inductance in layer M1 in the x direction is −0.005, the maximum sensitivity of inductance in layer M1 in the x direction is 0.015, the minimum sensitivity of inductance in layer M1 in the y direction is −0.003 and the maximum sensitivity of inductance in layer M1 in the y direction is 0.013.

As shown in FIG. 10, the netlist entry "L2 B C 8.8e-16 *$Slx_{AlphaAlpha}$ 1:−0.005 2:0.015 *$Sly_{AlphaAlpha}$ 1:−0.003 2:0.013" signifies that the inductance L2 between nodes B and C is 8.8e-16 henries if no mask shift occurs, the minimum sensitivity of inductance in layer M1 in the x direction is −0.005, the maximum sensitivity of inductance in layer M1 in the x direction is 0.015, the minimum sensitivity of inductance in layer M1 in the y direction is −0.003 and the maximum sensitivity of inductance in layer M1 in the y direction is 0.013.

Figure 11:
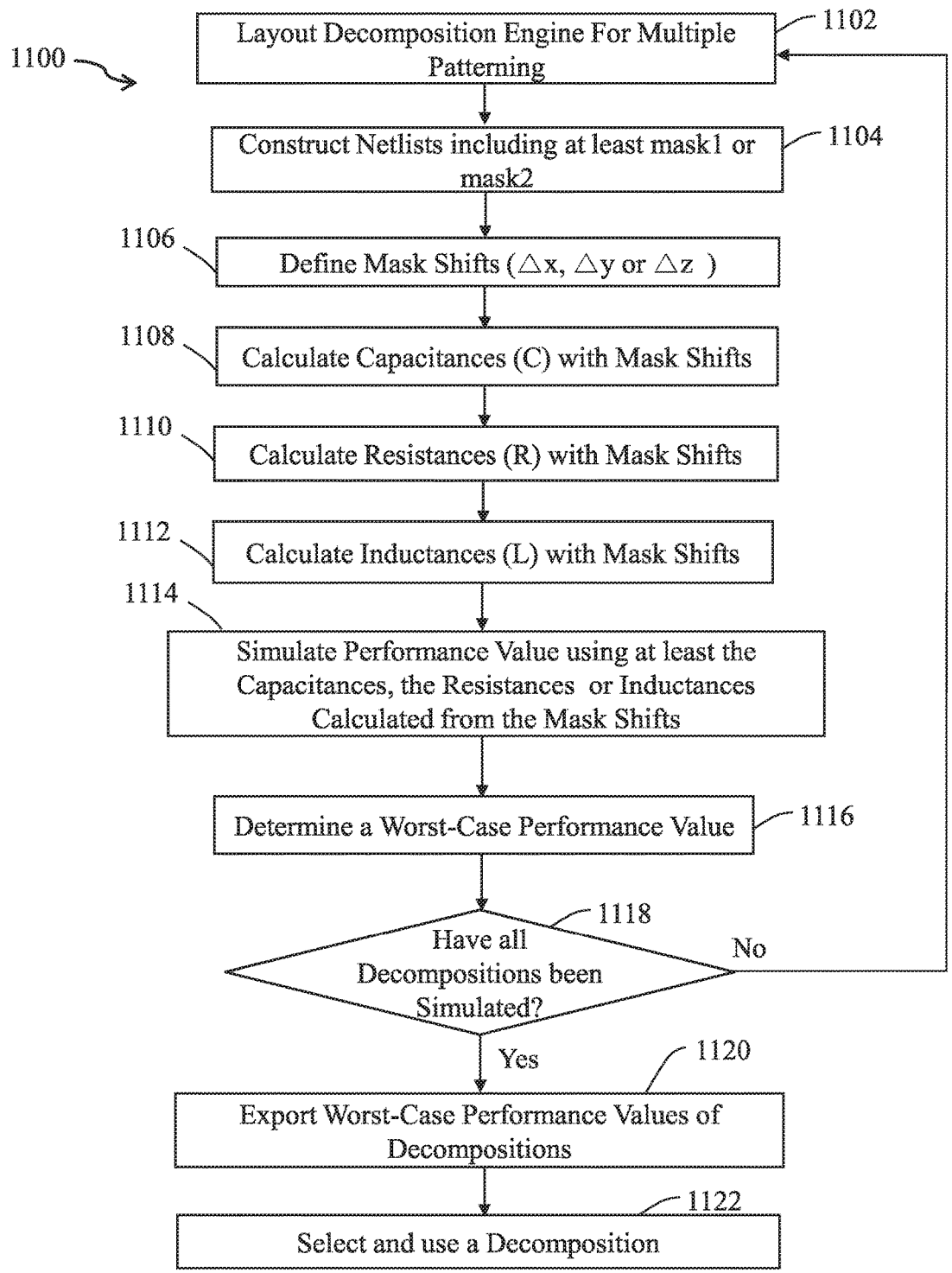
FIG. 11 is a flow chart of a method of determining an optimum decomposition of a semiconductor device in accordance with one or more embodiments.

FIG. 11 is a flow chart of a method 1100 of determining an optimum decomposition of a semiconductor device in accordance with one or more embodiments. Method 1100 begins with operation 1102 in which a layout of an integrated circuit is provided to a decomposition engine for performing decomposition. In some embodiments, the decomposition engine generates all available decompositions. In some embodiments, a decomposition is a process of dividing a single mask into multiple masks, where each of the multiple masks are a part of the same multiple patterning mask set.

In operation 1104, one or more netlists are generated. In some embodiments, for each decomposition that is generated, a corresponding netlist is generated. In some embodiments, the netlist comprises patterns in mask 1 or mask 2 that belong to the same multiple patterning mask set.

In operation 1106, one or more mask shifts are defined. In some embodiments, one or more mask shifts comprises shift ΔS_mask. In some embodiments, one or more mask shifts comprises shift Δx, shift Δy or shift Δz. In some embodiments, each mask shift comprises a maximum mask shift. In some embodiments, one or more mask shifts comprise translation shifts, magnification shifts or rotation shifts. In some embodiments, the mask shifts Δx, Δy and Δz are defined to fail within one or more ranges as defined in the netlist as minimum and maximum mask shifts (i.e., netlist 1000 as shown in FIG. 10).

For example, as shown in FIG. 10, in metal layer M1, the maximum translation shift in the −x direction is 0.01 and the maximum translation shift in the x direction is 0.03. In this example, for each decomposition, the mask shifts in the x direction will be within the range −0.01 and 0.03. In this example, the maximum translation shift in the −y direction is 0.01 and the maximum translation shift in the y direction is 0.03. In this example, for each decomposition, the mask shifts in the y direction will be within the range −0.01 and 0.03. In some embodiments, the maximum translation shift in the −z direction and z direction are also defined for each decomposition. In this example, by using the same z direction values as that shown for the x direction, in metal layer M1, the maximum translation shift n the −z direction is 0.01 and the maximum translation shift in the z direction is 0.03. In this example, for each decomposition, the mask shifts in the z direction will be within the range −0.01 and 0.03.

In operation 1108, for each of the decomposition combinations, the corresponding capacitance is calculated using formula 3. In some embodiments, the color bias techfile for capacitance for each mask pair (e.g., as shown in FIG. 2B) and the corresponding color bias sensitivity techfile for capacitance (e.g., as shown in FIG. 2D) are used with formula 3. In some embodiments, the maximum mask shifts contained in the netlist are used directly to calculate the performance value without being divided into steps resulting in a more efficient computation.

In operation 1110 for each of the decomposition combinations, the corresponding resistance is calculated using formula 6. In some embodiments, the color bias techfile for resistance for each of the masks (e.g., as shown in FIG. 5A) and the corresponding color bias sensitivity techfile for resistance (e.g., as shown in FIG. 7A) are used with formula 6. In some embodiments, the maximum mask shifts contained in the netlist are used directly to calculate the performance value without being divided into steps resulting in a more efficient computation.

In operation 1112, for each of the decomposition combinations, the corresponding inductance is calculated using formula 9. In some embodiments, the color bias techfile for inductance for each mask pair (e.g., as shown in FIG. 5B) and the corresponding color bias sensitivity techfile for inductance (e.g., as shown in FIG. 7B) are used with formula 9. In some embodiments, the maximum mask shifts contained in the netlist are used directly to calculate the performance value without being divided into steps resulting in a more efficient computation.

In operation 1114, the performance values are simulated using at least the capacitance values from operation 1108, the resistance values from operation 1110 or the inductance values from operation 1112. In some embodiments, the performance values comprise the timing of critical paths and noise. In some embodiments, operation 1114 is performed for each of the mask shift combinations.

In operation 1116, a worst case performance value is determined. In some embodiments, the performance values obtained from each of the different mask shift combinations are compared to find the worst-case performance value. In some embodiments, the performance values obtained from each of the different mask shift combinations are compared to find the worst-case performance value corresponding to the worst timing of critical paths. In some embodiments, the worst case performance value is recorded in storage medium 1204.

In operation 1118, the method of determining an optimum decomposition of a semiconductor device determines if the worst-case performance values of all decompositions have been calculated. If the method of determining an optimum decomposition of a semiconductor device determines the worst-case performance values of all decompositions have been calculated, the operation proceeds to operation 1120. If the method of determining an optimum decomposition of a semiconductor device determines the worst-case performance values of all decompositions have not been calculated, the operation proceeds to operation 1102. In some embodiments, the worst-case performance value obtained in operation 1106 corresponds to the worst-case performance value for one of the decompositions; method 1100 is iterated to determine the worst-case performance value for each of the available decompositions obtained in operation 1102.

In operation 1120, the worst-case performance values of decomposition are exported. In some embodiments, the worst-case performance values of decomposition are exported to an electronic design automation (EDA) tool. In some embodiments, the method 1100 of determining an optimum decomposition of a semiconductor device is part of an EDA tool.

In operation 1122, a decomposition is selected. In some embodiments, the selected decomposition is the best of the worst-case performance values of all decompositions. In some embodiments, the selected decomposition is the decomposition with the worst-case performance value that is the best among the worst-case performance values of all decompositions. In some embodiments, the selected decomposition is also used to perform multiple patterning lithography steps on semiconductor wafers.

In some embodiments, by selecting the decomposition from a plurality of multiple patterning decompositions, where the worst-case performance value of the decomposition is the best among the worst-case performance values of the plurality of multiple patterning decompositions, the minimum performance value requirement for the integrated circuit is satisfied.

In some embodiments, by selecting the decomposition that is the best among the worst-case performance values of all available decompositions, even if the worst-case scenario occurs, the minimum performance value requirement for the integrated circuit can still be satisfied, and the optimum performance value can be achieved.

In some embodiments, with the worst-case performance values being estimated at the time of design, a circuit designer performs a design margin analysis and determines whether the worst-case performance (e.g, the worst-case timing or the worse-case noise) is within the design margin. In some embodiments, by using the decomposition whose worst-case performance value is the best among all available decompositions, foundries manufacture integrated circuits using the best decomposition scheme.

Figure 12:
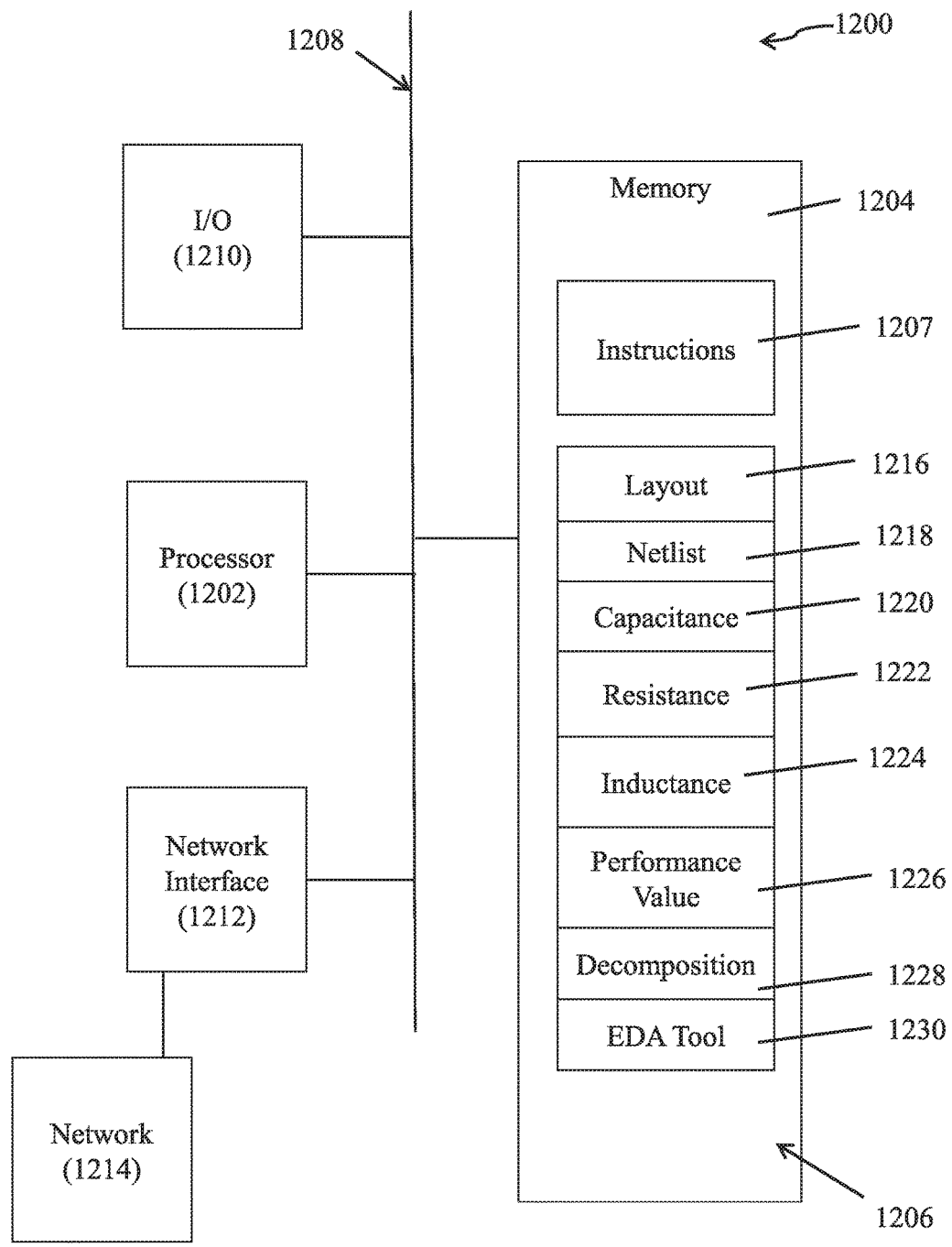
FIG. 12 is a block diagram of a control system for determining an optimum decomposition of a semiconductor device in accordance with one or more embodiments.

FIG. 12 is a block diagram of a control system 1200 for determining an optimum decomposition of a semiconductor device in accordance with one or more embodiments. In some embodiments, the control system 1200 is a general purpose computing device which implements method 1100 of FIG. 11 in accordance with one or more embodiments. Control system 1200 includes a hardware processor 1202 and a non-transitory, computer readable storage medium 1204 encoded with, i.e., storing, the computer program code 1206, i.e., a set of executable instructions. Computer readable storage medium 1204 is also encoded with instructions 1207 for interfacing with manufacturing machines for producing the semiconductor device. The processor 1202 is electrically coupled to the computer readable storage medium 1204 via a bus 1208. The processor 1202 is also electrically coupled to an I/O interface 1210 by bus 1208. A network interface 1212 is also electrically connected to the processor 1202 via bus 1208. Network interface 1212 is connected to a network 1214, so that processor 1202 and computer readable storage medium 1204 are capable of connecting to external elements via network 1214. The processor 1202 is configured to execute the computer program code 1206 encoded in the computer readable storage medium 1204 in order to cause system 1200 to be usable for performing a portion or all of the operations as described e.g., in method 1100.

In one or more embodiments, the processor 1202 is a central processing unit (CPU), a multi-processor, a distributed processing system, an application specific integrated circuit (ASIC), and/or a suitable processing unit.

In one or more embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 1204 includes a compact disk-read only memory (CD-ROM), a compact disk-read/write (CD-R/W), and/or a digital video disc (DVD).

In one or more embodiments, the storage medium 1204 stores the computer program code 1206 configured to cause system 1200 to perform method 1100. In one or more embodiments, the storage medium 1204 also stores information needed for performing method 1100 as well as information generated during performing method 1100, such as layout 1216, netlist 1218, capacitance 1220, resistance 1222, inductance 1224, performance value 1226, decomposition 1228, EDA Tool 1230, and/or a set of executable instructions to perform the operation of method 1100.

In one or more embodiments, the storage medium 1204 stores instructions 1207 for interfacing with external machines. The instructions 1207 enable processor 1202 to generate instructions readable by the external machines to effectively implement method 1100 during a design process. In some embodiments, the design process is of a semiconductor device including one or more circuit elements.

Control system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

Control system 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1394. In one or more embodiments, method 1100 are implemented in two or more systems 1200, and information such as layout 1216, netlist 1218, capacitance 1220, resistance 1222, inductance 1224, performance value 1226, decomposition 1228, EDA Tool 1230 are exchanged between different systems 1200 via network 1214.

System 1200 is configured to receive information related to a layout through I/O interface 1210. The information is transferred to processor 1202 via bus 1208 to generate UI. The layout is then stored in computer readable medium 1204 as layout 1216. Control system 1200 is configured to receive information related to a netlist through I/O interface 1210. The information is stored in computer readable medium 1204 as netlist 1218. Control system 1200 is configured to receive information related to a capacitance through I/O interface 1210. The information is stored in computer readable medium 1204 as capacitance 1220. Control system 1200 is configured to receive information related to a resistance through I/O interface 1210. The information is stored in computer readable medium 1204 as resistance 1222. Control system 1200 is configured to receive information related to an inductance through I/O interface 1210. The information is stored in computer readable medium 1204 as inductance 1224. Control system 1200 is configured to receive information related to a performance value through I/O interface 1210. The information is stored in computer readable medium 1204 as performance value 1226. Control system 1200 is configured to receive information related to a decomposition through I/O interface 1210. The information is stored in computer readable medium 1204 as decomposition 1228. Control system 1200 is configured to receive information related to an EDA Tool through I/O interface 1210. The information is stored in computer readable medium 1204 as EDA Tool 1230.

In some embodiments, the method 1100 is implemented as a standalone software application. In some embodiments, the method 1100 is implemented as a software application that is a part of an additional software application. In some embodiments, the method 1100 is implemented as a plug-in to a software application. In some embodiments, the method 1100 is implemented as a software application that is a portion of the EDA tool. In some embodiments, the method 1100 is implemented as a software application that is used by an EDA tool. In some embodiments, the EDA tool is used to generate a layout of the semiconductor device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design.

One of ordinary skill in the art would recognize that an order of operations in method 1100 is adjustable. One of ordinary skill in the art would further recognize that additional steps are able to be included in method 1100 without departing from the scope of this description.

One aspect of this description relates to a method comprising generating, by a processor, a plurality of multiple patterning decompositions from a layout of an integrated circuit. Each of the plurality of multiple patterning decompositions comprises patterns separated into a first mask and a second mask of a multiple patterning mask set. The method includes generating one or more files comprising capacitances of patterns in the layout as a function of spacing between the patterns and sensitivities of the capacitances to changes in the spacing between the patterns. Respective worst-case performance values are determined for each of the plurality of multiple patterning decompositions based on the sensitivities of the capacitances and one or more mask shifts within a range defined by a respective maximum mask shift for each multiple patterning mask set. A mask set is manufactured based on at least one of the plurality of multiple patterning decompositions for use in performing multiple pattern lithography on a wafer.

Another aspect of this description relates to a method comprising generating, by a processor, a plurality of multiple patterning decompositions from a layout of an integrated circuit. Each of the plurality of multiple patterning decompositions comprises patterns separated into a first mask and a second mask of a multiple patterning mask set. One or more files are generated having capacitances, resistances, and inductances of patterns in the layout as a function of spacing between the patterns, and sensitivities of the capacitances, resistances, and inductances of patterns in the layout as a function of changes in the spacing. A mask set is selected based on at least one of the one or more generated files. The selected mask set is generated for use in performing multiple pattern lithography on a wafer.

Still another aspect of this description relates to a non-transitory computer readable storage medium comprising computer executable instructions for carrying out a method for designing a semiconductor device. The method implemented by the instructions comprises generating a plurality of multiple patterning decompositions from a layout of an integrated circuit, wherein each of the plurality of multiple patterning decompositions comprises patterns separated into a first mask and a second mask of a multiple patterning mask set. For each of the plurality of multiple patterning decompositions a plurality of possible mask shifts are generated. Each of the plurality of possible mask shifts is within a range defined by a maximum mask shift. One or more capacitances for the plurality of possible mask shifts are calculated, wherein the one or more capacitances are calculated based on sensitivities of capacitances to changes in spacing between patterns of the layout. One or more performance values are calculated based on the one or more capacitances. A worst-case performance value is selected from the one or more performance values. The method includes selecting from the plurality of multiple patterning decompositions a multiple patterning decomposition having a worst-case performance value that is the best worst-case performance value among the worst-case performance values. The layout is implemented on a wafer using the selected multiple patterning decomposition.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method comprising:
  generating, by a processor, a plurality of multiple patterning decompositions from a layout of an integrated circuit design, wherein each of the plurality of multiple patterning decompositions comprises patterns separated into a first mask and a second mask of a multiple patterning mask set;
  generating one or more files comprising:
    capacitances of patterns in the layout as a function of spacing between the patterns,
    sensitivities of the capacitances to changes in the spacing between the patterns,
    inductances of patterns in the layout as a function of spacing between the patterns, and
    sensitivities of inductances to changes in the spacing between the patterns;
  determining a respective worst-case performance value for each of the plurality of multiple patterning decompositions based on the sensitivities of the capacitances and inductances, and one or more mask shifts within a range defined by a respective maximum mask shift for each multiple patterning mask set; and
  manufacturing a physical mask set based on at least one of the plurality of multiple patterning decompositions for use in performing multiple pattern lithography on a wafer.

2. The method of claim 1 further comprising:
  comparing the worst-case performance values of the plurality of multiple patterning decompositions; and
  selecting a patterning decomposition from the plurality of multiple patterning decompositions, wherein the worst-case performance value of the selected patterning decomposition is a best worst-case performance value among the worst-case performance values.

3. The method of claim 1, wherein at least the first mask or the second mask is associated with a corresponding polygon.

4. The method of claim 1 wherein the generating one or more files comprises generating one or more files comprising:
  resistances of patterns in the layout as a function of spacing between the patterns,
  sensitivities of resistances to changes in the spacing between the patterns, and
  wherein the determining the worst-case performance values is based on at least one of the sensitivities of inductances and the sensitivities of resistances.

5. The method of claim 1, wherein the worst-case performance value comprises a timing of a critical path of the layout.

6. The method of claim 1, wherein the worst-case performance value comprises a noise of a critical path of the layout.

7. The method of claim 1, wherein the one or more files are used in determining the corresponding worst-case performance value for each of the plurality of multiple patterning decompositions.

8. The method of claim 1, further comprising:
  retrieving a capacitance from the one or more files;
  calculating a new capacitance by adding to the retrieved capacitance a product of a mask shift and a corresponding sensitivity of capacitance; and
  using the new capacitance to calculate a performance value of the integrated circuit design.

9. The method of claim 8, wherein the step of calculating the new capacitance is performed using an equation:

$$C = C_0 + Scx^*(\Delta x) + Scy^*(\Delta y) + Scz^*(\Delta z)$$

wherein C is the new capacitance and $C_0$ is a capacitance without any mask shift,
  wherein Scx is a sensitivity of the capacitance to a mask shift in a x direction,
  wherein Scy is a sensitivity of the capacitance to a mask shift in a y direction,
  wherein Scz is a sensitivity of the capacitance to a mask shift in a z direction, and
  wherein $\Delta x$ is the mask shift in the x direction, $\Delta y$ is the mask shift in the y direction and $\Delta z$ is the mask shift in the z direction.

10. A method comprising:
  generating, by a processor, a plurality of multiple patterning decompositions from a layout of an integrated circuit design, wherein each of the plurality of multiple patterning decompositions comprises patterns separated into a first mask and a second mask of a multiple patterning mask set;
  generating one or more files comprising:
    capacitances, resistances, and inductances of patterns in the layout as a function of spacing between the patterns, and
    capacitance, resistance, and inductance sensitivities of the capacitances,
  resistances, and inductances of patterns in the layout as a function of changes in the spacing;
  selecting a mask set based on at least one of the one or more generated files; and
  manufacturing a physical mask set based on the selected mask set for use in performing multiple pattern lithography on a wafer.

11. The method of claim 10, further comprising:
  determining a worst-case performance value for each of the plurality of multiple patterning decompositions, wherein the worst-case performance values are based on one or more mask shifts within a mask shift range defined by a maximum mask shift.

12. The method of claim 11, further comprising:
comparing at least two of the worst-case performance values to one another; and
selecting a patterning decomposition from among the plurality of multiple patterning decompositions, wherein the selected patterning decomposition has a worst-case performance value that is a best worst-case performance value among the worst-case performance values.

13. The method of claim 11 wherein the worst-case performance value comprises a timing of a critical path of the layout.

14. The method of claim 11 wherein the worst-case performance value comprises a noise of a critical path of the layout.

15. The method of claim 11 wherein the mask shifts are in one or more of an 'x' direction, a 'y' direction, and a 'z' direction.

16. A non-transitory computer readable storage medium comprising computer executable instructions for carrying out a method for designing a semiconductor device, the method comprising:
generating a plurality of multiple patterning decompositions from a layout of an integrated circuit design, wherein each of the plurality of multiple patterning decompositions comprises patterns separated into a first mask and a second mask of a multiple patterning mask set;
for each of the plurality of multiple patterning decompositions:
generating a plurality of possible mask shifts, wherein each of the plurality of possible mask shifts is within a range defined by a maximum mask shift,
calculating one or more capacitances for the plurality of possible mask shifts, wherein the one or more capacitances are calculated based on sensitivities of capacitances to changes in spacing between patterns of the layout,
calculating one or more inductances for the plurality of possible mask shifts, wherein the one or more inductances are calculated based on sensitivities of inductances to changes in spacing between patterns of the layout,
calculating one or more performance values based on the one or more capacitances and inductances, and
selecting a worst-case performance value from the one or more performance values;
selecting from the plurality of multiple patterning decompositions a multiple patterning decomposition having a worst-case performance value that is a best worst-case performance value among the worst-case performance values; and
implementing the layout on a wafer using the selected multiple patterning decomposition.

17. The non-transitory computer readable storage medium of claim 16, wherein each of the one or more capacitances is a function of a corresponding pattern width.

18. The non-transitory computer readable storage medium of claim 16 wherein, for each of the plurality of multiple patterning decompositions:
calculating one or more resistances for the plurality of possible mask shifts, wherein the one or more resistances are calculated based on sensitivities of resistances to changes in spacing between patterns of the layout.

19. The non-transitory computer readable storage medium of claim 16, wherein the one or more performance values comprise a timing of a critical path of the layout.

20. The non-transitory computer readable storage medium of claim 16, wherein the one or more performance values comprise a noise of a critical path of the layout.

* * * * *